US012615967B2

(12) United States Patent
    Debashis et al.

(10) Patent No.: US 12,615,967 B2
(45) Date of Patent: Apr. 28, 2026

(54) MAGNETOELECTRIC LOGIC WITH MAGNETIC TUNNEL JUNCTIONS

(71) Applicant: Intel Corporation, Santa Clara, CA (US)

(72) Inventors: Punyashloka Debashis, Hillsboro, OR (US); Dominique A. Adams, Portland, OR (US); Hai Li, Portland, OR (US); Chia-Ching Lin, Portland, OR (US); Dmitri Evgenievich Nikonov, Beaverton, OR (US); Kaan Oguz, Portland, OR (US); John J. Plombon, Portland, OR (US); Ian Alexander Young, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 654 days.

(21) Appl. No.: 17/978,145

(22) Filed: Oct. 31, 2022

(65) Prior Publication Data

US 2024/0147867 A1     May 2, 2024

(51) Int. Cl.
    H10N 50/10     (2023.01)
    G11C 11/16     (2006.01)
            (Continued)

(52) U.S. Cl.
    CPC ........... H10N 50/10 (2023.02); G11C 11/161 (2013.01); H01L 23/5226 (2013.01);
            (Continued)

(58) Field of Classification Search
    CPC ...... H10N 50/10; H10N 50/85; G11C 11/161; H01L 23/5226; H01L 23/5283; H10B 61/22
    See application file for complete search history.

(56) References Cited

U.S. PATENT DOCUMENTS 9,076,954 B2 *  7/2015  Khvalkovskiy ..... G11C 11/1659
9,276,040 B1    3/2016  Marshall et al.
            (Continued)

OTHER PUBLICATIONS

AZ. Simoes et al., Piezoelectric behavior of SrRuO3 buffered lanthanum modified bismuth ferrite thin films grown by chemical method (Year: 2008).

(Continued)

*Primary Examiner* — Allison Bernstein

(74) *Attorney, Agent, or Firm* — Alliance IP, LLC

(57)            ABSTRACT

Magnetoelectric magnetic tunnel junction (MEMTJ) logic devices comprise a magnetoelectric switching capacitor coupled to a pair of magnetic tunnel junctions (MTJs) by a conductive layer. The logic state of the MEMTJ is represented by the magnetization orientation of the ferromagnetic layer of the magnetoelectric capacitor, which can be switched through the application of an appropriate input voltage to the MEMTJ. The magnetization orientation of the magnetoelectric capacitor ferromagnetic layer is read out by the MTJs. The conductive layer is positioned between the capacitor and the MTJs. The MTJ ferromagnetic free layers are exchange coupled to the ferromagnetic layer of the magnetoelectric capacitor. The potential of an MTJ free layer is based on a supply voltage applied to the reference layer of the MTJ. The MTJ reference layers have a magnetization orientation that is parallel or antiparallel to the magnetization orientations of the ferromagnetic layer of the magnetoelectric capacitor.

25 Claims, 11 Drawing Sheets

(51) Int. Cl.
| | |
|---|---|
| *H01L 23/522* | (2006.01) |
| *H01L 23/528* | (2006.01) |
| *H10B 61/00* | (2023.01) |
| *H10N 50/85* | (2023.01) |

(52) U.S. Cl.
CPC ......... *H01L 23/5283* (2013.01); *H10B 61/22* (2023.02); *H10N 50/85* (2023.02)

(56) References Cited

U.S. PATENT DOCUMENTS

| | | | |
|---|---|---|---|
| 11,222,920 B2 * | 1/2022 | Prasad ................ | G11C 11/5607 |
| 2016/0276006 A1 | 9/2016 | Ralph et al. | |
| 2017/0104150 A1 | 4/2017 | Shi et al. | |
| 2018/0026645 A1 | 1/2018 | Pan et al. | |
| 2023/0100649 A1 * | 3/2023 | Li ......................... | H10N 50/85 |
| | | | 257/421 |

OTHER PUBLICATIONS

C. Pan et al., Beyond CMOS Device Benchmarking for Boolean and Non-Boolean Logic Applications, IEEE Journal on Exploratory Solid-State Computational Devices and Circuits (Year: 2017).

N. Sharma et al., Evolving magneto-electric device technologies (Year: 2020).

USPTO Non-Final Office Action in U.S. Appl. No. 17/485,265 mailed on Feb. 26, 2025 (12 pages).

U.S. Appl. No. 17/485,265, filed Sep. 24, 2021 entitled, Magnetoelectric Logic With Magnetic Tunnel Junctions (52 pages).

* cited by examiner

500

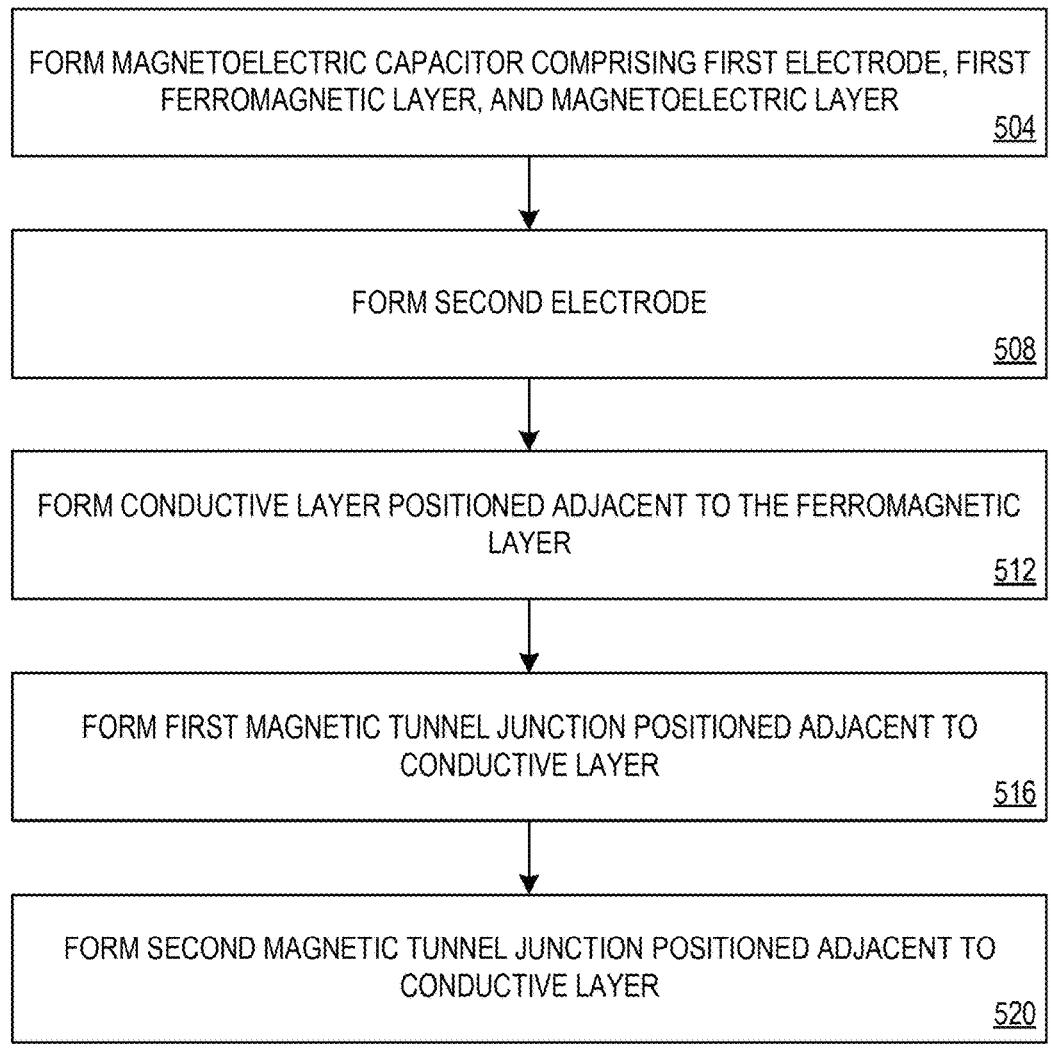

FORM MAGNETOELECTRIC CAPACITOR COMPRISING FIRST ELECTRODE, FIRST FERROMAGNETIC LAYER, AND MAGNETOELECTRIC LAYER

504

FORM SECOND ELECTRODE

508

FORM CONDUCTIVE LAYER POSITIONED ADJACENT TO THE FERROMAGNETIC LAYER

512

FORM FIRST MAGNETIC TUNNEL JUNCTION POSITIONED ADJACENT TO CONDUCTIVE LAYER

516

FORM SECOND MAGNETIC TUNNEL JUNCTION POSITIONED ADJACENT TO CONDUCTIVE LAYER

| PROCESSOR UNIT 1002 | COMMUNICATION COMPONENT 1012 |
| MEMORY 1004 | BATTERY/POWER 1014 |
| DISPLAY DEVICE 1006 | GNSS DEVICE 1018 |
| AUDIO OUTPUT DEVICE 1008 | AUDIO INPUT DEVICE 1024 |
| ANOTHER OUTPUT DEVICE 1010 | ANOTHER INPUT DEVICE 1020 |

ANTENNA 1022

MAGNETOELECTRIC LOGIC WITH MAGNETIC TUNNEL JUNCTIONS

BACKGROUND

Magnetoelectric switching capacitors comprise an insulating layer between a ferromagnetic layer and another electrode. Application of a potential difference across the magnetoelectric capacitor can cause the magnetization orientation of the ferromagnetic layer to switch if the magnitude of the potential difference is large enough. Magnetic tunnel junctions are devices in which electrons can tunnel through a thin insulating layer positioned between two ferromagnets with the amount of current at a given voltage that can flow between the ferromagnets depending on the relative orientation of magnetization between the two ferromagnets.

BRIEF DESCRIPTION OF THE DRAWINGS

FIG. 5 is an example method of forming a MEMTJ.

DETAILED DESCRIPTION

Figure 1A:
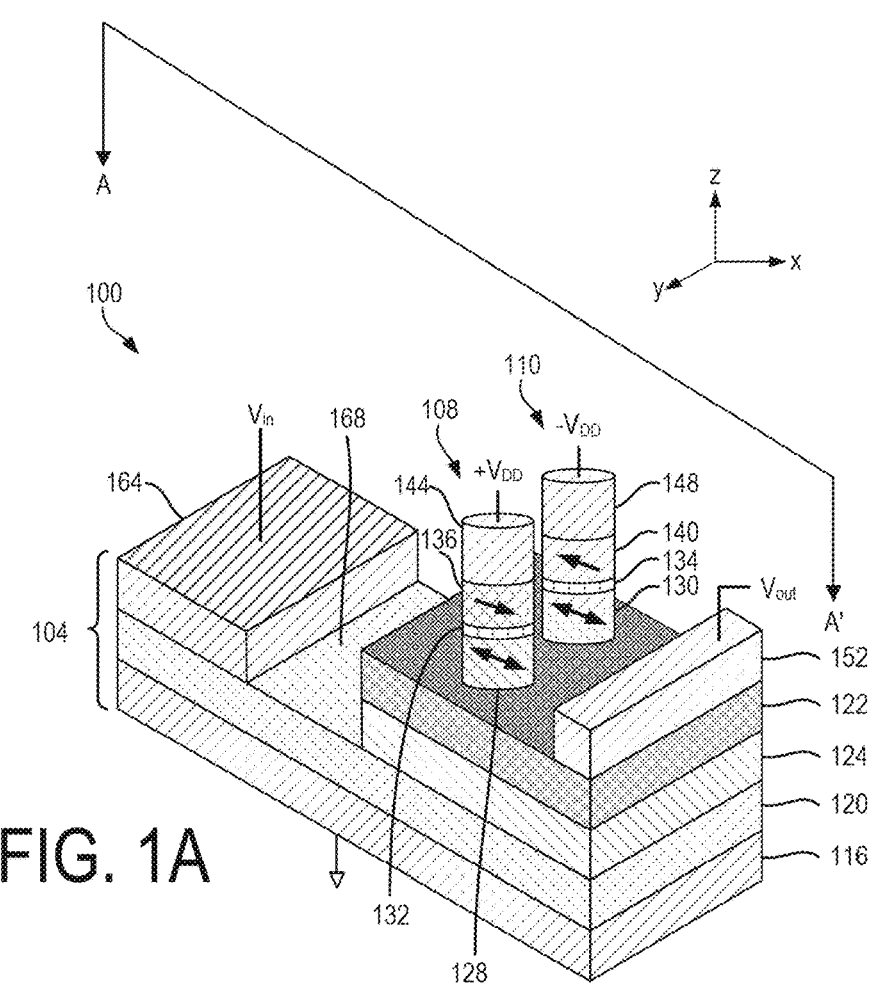
FIG. 1A illustrates a perspective view of an example magnetoelectric magnetic tunnel junction (MEMTJ).

Numerous device types are being examined as alternatives to CMOS (complementary metal-oxide-semiconductor) devices as the scaling of fabrication technologies extends to minimum feature sizes on the scale of ones of nanometers. Magnetoelectric spin-orbit (MESO) devices are one such device type being examined. MESO devices comprise a magnetoelectric switching capacitor coupled to a spin-to-charge conversion module. The magnetoelectric capacitor comprises a magnetoelectric layer positioned between a ferromagnet (nanomagnet) and another electrode and the logic state of the MESO device is represented by the orientation of the magnetization of the ferromagnet. The logic state of the MESO device is switched through the application of a voltage across the magnetoelectric capacitor that changes the ferroelectric polarization of the magnetoelectric layer. The magnetoelectric layer's ferroelectric polarization couples with its antiferromagnetic order and causes the canted magnetization of the magnetoelectric layer to flip. The magnetoelectric layer and the ferromagnetic layer of the magnetoelectric capacitor are coupled via magnetic exchange and the switching of the antiferromagnetic order, as well as the canted magnetization orientation of the magnetoelectric layer, induces switching of the magnetization orientation of the ferromagnetic layer. The magnetization state of the ferromagnet, and hence, the logic state of the MESO device, is read out by the spin-to-charge conversion module, which converts the ferromagnet magnetization orientation to an output current and voltage. The direction of output current flow and the sign of the output voltage depends on the orientation of the ferromagnet in the magnetoelectric capacitor.

While MESO devices have low switching energy, their potential use as logic gates may be limited with the use of some currently available materials in the output module as their spin-to-charge conversion mechanism may be too weak to generate sufficient output current to change the logic state of another MESO device. That is, for MESO devices to be viable as logic gates, a MESO device output voltage needs to exceed the switching voltage (e.g., $V_{coercive}$) of the magnetoelectric capacitor of a succeeding MESO device.

Disclosed herein is a magnetoelectric magnetic tunnel junction (MEMTJ) device, a spintronic device comprising a magnetoelectric switching capacitor coupled to a pair of magnetic tunnel junctions (MTJs) for reading out the logic state of the MEMTJ. The MEMTJ has the low switching energy of a MESO device and a strong enough output signal to switch the logic state of another MEMTJ device. As such, MEMTJs may be usable as logic gates in cascading logic with some presently available materials.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, an orientation of the magnetization of a layer that is substantially parallel or anti-parallel to the orientation of the magnetization of another layer includes layers that have a magnetization orientation within a few degrees of parallel or antiparallel to the magnetization of the other layer. Similarly, the surface of a layer that is "substantially parallel" to the surface of another layer includes layers whose surface is within a few degrees of parallel to the surface of the other layer.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the term "integrated circuit component" refers to a packaged or unpacked integrated circuit product. A packaged integrated circuit component comprises one or more integrated circuit dies mounted on a package substrate with the integrated circuit dies and package substrate encapsulated in a casing material, such as a metal, plastic, glass, or ceramic. In one example, a packaged integrated circuit component contains one or more processor units mounted on a substrate with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system components described or referenced herein or any other computing system component, such as a processor unit (e.g., system-on-a-chip (SoC), processor core, graphics processor unit (GPU), accelerator, chipset processor), I/O controller, memory, or network interface controller. An integrated circuit component can comprise one or more MEMTJs and the MEMTJs can be utilized in processor units, memories, or in any other component within an integrated circuit component.

As used herein, the phrase "conductively coupled" refers to layers or components that are coupled to facilitate the flow of current between them. For example, an electrode of a MEMTJ is conductively coupled to a line of an interconnect layer due to the electrode being connected to the line by a via or the electrode being positioned adjacent to the line.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

Figure 1B:
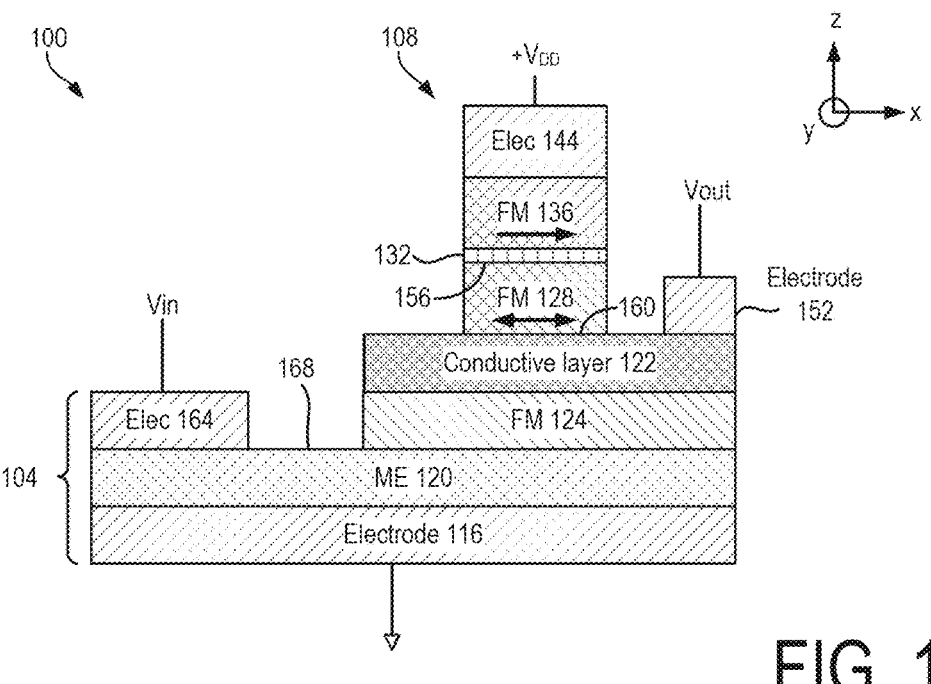
FIG. 1B illustrates a cross-sectional view of the MEMTJ of FIG. 1A taken along the line A-A'.

FIG. 1A illustrates a perspective view of an example magnetoelectric magnetic tunnel junction (MEMTJ). FIG. 1B illustrates a cross-sectional view of the MEMTJ of FIG. 1A taken along the line A-A'. The MEMTJ 100 comprises a magnetoelectric switching capacitor (or magnetoelectric stack, magnetoelectric module) 104 coupled to a pair of magnetic tunnel junctions (MTJs) 108 and 110 (or output module, read-out module) by a conductive layer 122. The magnetoelectric switching capacitor 104 comprises an electrode 116, a ferromagnetic layer (ferromagnet or nanomagnet) 124, and a magnetoelectric layer 120 positioned between and adjacent to the electrode 116 and the ferromagnetic layer 124. The magnetoelectric layer 120 is further positioned between an electrode 164 and the electrode 116, the electrode 116 and the ferromagnetic layer 124 located on a surface 168 of the magnetoelectric layer 120. The MTJ 108 comprises a ferromagnetic free layer 128, a reference ferromagnetic layer 136, and an insulating layer 132 positioned between and adjacent to the ferromagnetic layers 128 and 136. The second MTJ 110 comprises a ferromagnetic free layer 130, a reference ferromagnetic layer 140, and an insulating layer 134 positioned between and adjacent to the ferromagnetic layers 130 and 140. The ferromagnetic free and reference layers are represented by double-headed and single-headed arrows, respectively, in FIGS. 1A-1C. The insulating layers 132 and 134 are tunneling barriers that provide a magnetoresistance to the MTJs, a change in resistance in response to the relative magnetization orientations of the ferromagnets of the MTJs. In one embodiment, the insulating layers 132 and 134 comprise magnesium oxide (MgO). The conductive layer 122 is electrically conductive and is positioned between and adjacent to the ferromagnetic layers 124 and the ferromagnetic free layers 128 and 130 of the MTJs 108 and 110. Supply voltages ($+V_{DD}$, $-V_{DD}$) are provided to the MTJs 108 and 110 by electrodes 144 and 148 positioned adjacent to the reference ferromagnetic layers 136 and 140, respectively. An electrode 152 is located on the conductive layer 122. The electrode 164 acts as the input to the MEMTJ 100 and the electrode 152 acts as the output of the MEMTJ 100. The electrode 116 positioned adjacent to the magnetoelectric layer 120 is tied to ground.

In some embodiments, a first element (e.g., layer) of the MEMTJ 100 mentioned above as being positioned adjacent to a second element of the MEMTJ 100 may be located on the second element. That is, there may be one or more intervening layers between the first and second elements. Such an intervening layer can enable or improve the manufacturability of the MEMTJ or increase reliability of the MEMTJ, such as a seed layer, diffusion barrier, etch stop layer, or oxidation layer.

The logic state of the MEMTJ 100 is switched by establishing a voltage differential across the magnetoelectric layer 120 having a polarity and sufficient magnitude to cause the magnetization orientation of the ferromagnetic layer 124 to switch. With the potential of the electrode 116 set to ground, the application of a positive voltage (V) to the electrode 164 causes the magnetization orientation of the ferromagnetic layer 124 to be set to a first orientation and the MEMTJ 100 to be set to a first logic state. Application of a negative voltage to the input electrode 164 causes the magnetization orientation of the ferromagnetic layer 124 to be set to a second orientation that is substantially opposite to that of the first orientation and the MEMTJ 100 to be set to a second logic state.

The MEMTJ 100 switches logic state as follows. Application of a positive voltage to the input electrode 164 causes the ferroelectric polarization of the magnetoelectric layer 120 to point downward. As the magnetoelectric layer 120 is a multiferroic layer, its ferroelectric polarization is coupled to its antiferromagnetic as well as canted magnetization vectors.

Therefore, the canted magnetization vector of the magnetoelectric layer 120 will become oriented horizontally in a certain direction. The antiferromagnetic vector and the canted magnetization vector of the magnetoelectric layer 120 are coupled to the magnetization of the ferromagnetic layer 124 through exchange bias and exchange coupling, respectively and, if the magnitude of potential difference applied across the magnetoelectric capacitor 104 is large enough, the magnetization of the ferromagnetic layer 124 becomes horizontally aligned with the canted magnetization vector of the magnetoelectric layer 120. The conductive layer 122 is electrically conductive and non-magnetic. The ferromagnetic coupling between the ferromagnetic layer 124 and the ferromagnetic free layers 128 and 130 of the MTJs 108 and 110 provides for the magnetization of the ferromagnetic free layers 128 and 130 to switch with that of ferromagnetic layer 124. Similarly, the application of a negative input voltage having sufficient magnitude to the input electrode 164 of the MEMTJ 100 can cause the magnetization orientation of the ferromagnetic layers 124, 128, and 130 to be in the opposite direction as the magnetization orientation of the ferromagnetic layers 124, 128, and 130 when a sufficient positive voltage is applied to the electrode 164. The electrical conductivity provided by the conductive layer 122 provides a low resistance path between the MTJs 108 and 110 and the electrode 152.

Thus, the two logic states of the MEMTJ 100 are represented in the leftward and rightward orientation of the magnetization of the ferromagnetic layers 124, 128, and 130. As the magnetization orientation of the ferromagnetic layers 124, 128, and 130 remains set until the MEMTJ 100 switches logic states, the MEMTJ is a non-volatile device. That is, a MEMTJ can retain its logic state after power is no longer supplied to any processor unit, integrated circuit component, or computing device in which the MEMTJ is located. The non-volatility of MEMTJ devices may allow a computing device to retain at least part of its state after being powered down. This may allow a computing device comprising MEMTJs from incurring the expense of having to store its state before shutting down or entering a deep idle state and reloading its state upon powering back up or transitioning from a deep idle state to an active state.

The MTJs 108 and 110 convert the magnetization orientation of the ferromagnetic layers 128 and 130 into an output voltage by selectively providing a low resistance path between the electrode 152 and one of the ferromagnetic layers 136 and 140. In an MTJ, the insulating layer between the two ferromagnets is an electrically insulating and non-magnetic layer that is thin enough to allow for electrons to tunnel between the two ferromagnets. The magnitude of the tunneling current at a fixed voltage and hence the resistance of the MTJ is dependent on the relative magnetization of the two ferromagnets. The tunneling current is greater (and the MTJ resistance is less) if the magnetization orientations of the two ferromagnets are parallel and the tunneling current is less (and the MTJ resistance greater) if the magnetization orientations of the ferromagnets are anti-parallel.

Figure 1C:
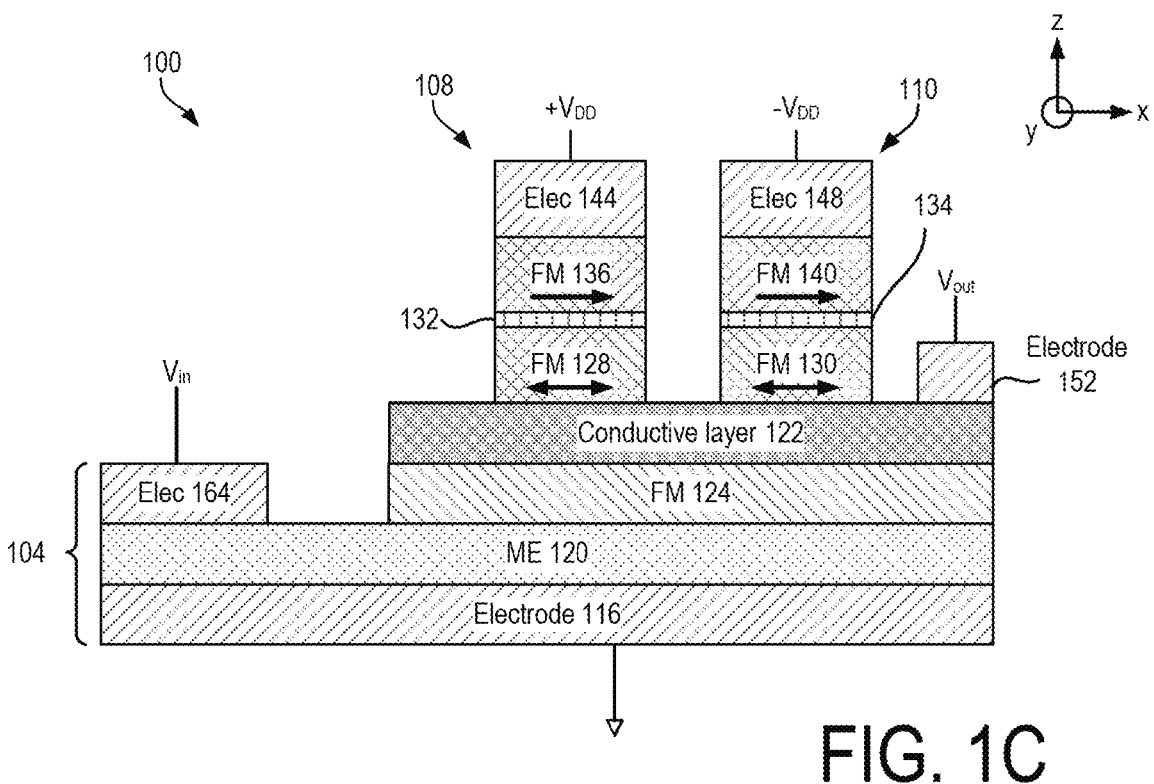
FIG. 1C illustrates a cross-sectional view of a variation of the MEMTJ of FIG. 1B with the MTJs arranged along an axis extending from the MEMTJ input electrode to the MEMTJ output electrode.

To selectively provide a low resistance path between the output electrode 152 and one of the MTJ ferromagnetic reference layers 136 and 140, the magnetization of the reference ferromagnetic layers 136 and 140 are oriented in substantially opposite orientations, as indicated by the single-headed arrows in FIGS. 1A-1C. The ferromagnetic layers 136 and 140 are reference ferromagnetic layers in that their magnetization orientation does not change in response to the switching of the magnetization orientation of the ferromagnetic free layers 128 and 130, respectively. The higher stability of the magnetic orientation of the reference layers 136 and 140 is measured by their coercive fields, the external magnetic field necessary to switch the orientation of their magnetization. A higher coercive field can be achieved by, for example, one of the following methods. The reference layers can have a higher shape anisotropy; or they can be formed of a different material and have a higher material anisotropy (e.g., higher magnetocrystalline anisotropy); or they can be coupled by the magnetic dipole interaction or by quantum exchange interaction to another ferromagnet with higher coercive field; or they can be coupled by quantum exchange interaction to an anti-ferromagnet, which is not affected by an external magnetic field; or they can be under strain (due to, for example, being deposited on a layer with a different crystal lattice parameter). In some embodiments, a higher shape anisotropy for the reference layers can be realized by the reference ferromagnetic layers 136 and 140 being thicker than the ferromagnetic free layers 128 and 130, respectively. In some embodiments where the reference ferromagnetic layers 136 and 140 have a higher anisotropy than the ferromagnetic free layers 128 and 130 due to the reference layers 136 and 140 having a higher material anisotropy than the ferromagnetic free layers 128 and 130, the reference ferromagnetic layers 136 and 140 comprise CoFeB or NiFe (permalloy) and the ferromagnetic free layers 128 and 130 comprise Co, Fe, or $CoFe_2O_4$.

The magnetization orientations of the reference layers 136 and 140 can be opposite from each other. The magnetization orientations of the reference layers 136 and 140 can be set during fabrication of the MEMTJ by, for example, annealing one of the reference layers while the reference layer is subjected to an external magnetic field having a first orientation and annealing the other reference layer while the other reference layer is subjected to an external magnetic field having an orientation that is opposite to the first orientation.

By utilizing two MTJs with their fixed layer magnetization orientations designed to be opposite to each other, the output voltage of MEMTJ 100 is based on a voltage division between $+V_{DD}$ and $-V_{DD}$. With the reference ferromagnetic layer 136 having a rightward magnetization orientation and the reference ferromagnetic layer 140 having a leftward magnetization orientation, when the magnetization of the ferromagnetic layer 128 is oriented rightward, the MTJ 108 is in its low resistance state and the MTJ 110 is in its high resistance state and the potentials of the ferromagnetic layer 128 and the output electrode 152 are closer to $+V_{DD}$ (the supply voltage supplied to the electrode 144 of MTJ 108) than $-V_{DD}$. When the magnetization of the ferromagnetic layer 128 is oriented leftward, the MTJ 108 is in its high resistance state and the MTJ 110 is in its low resistance state and the potentials of the ferromagnetic layer 128 and the output electrode 152 are closer to $-V_{DD}$ (the supply voltage supplied to the electrode 148 of the MTJ 110) than $+V_{DD}$. Thus, the MEMTJ provides a bipolar output voltage that switches sign when the magnetic orientation of the ferromagnetic layer 124 is switched.

The magnitude of the MTJ supply voltages $+V_{DD}$ and $-V_{DD}$ needed to result in MEMTJ output voltage swings large enough to switch the logic state of a succeeding MEMTJ can be estimated as follows. The magnitude of the MEMTJ output voltage Vout can be expressed as a function of the magnitude of the MTJ supply voltages ($+V_{DD}$, $-V_{DD}$) according to equation 1.

$$Vout = \pm V_{DD}\frac{Rap - Rp}{Rap + Rp} = \pm V_{DD}\frac{TMR}{TMR + 2} \qquad \text{Eq. 1}$$

where TMR is a measure of the relative resistance change in an MTJ between its parallel and antiparallel states, as provided by TMR=(Rap–Rp)/Rp, where Rap is the resistance of an MTJ in its high resistance antiparallel state and Rp is the resistance of the MTJ in its low resistance parallel state.

In some existing MTJs, TMR can be at least 200%. Substituting a value of TMR=200% into equation 1 gives:

$$Vout = V_{DD}\frac{TMR}{TMR + 2} = V_{DD}\frac{2}{2 + 2} = V_{DD} * 0.5 \qquad \text{Eq. 3}$$

Thus, if a $V_{out}$ of 100 mV is desired, which is greater than the switching voltage of a MEMTJ magnetoelectric switching capacitor (which can be on the order of 10 mV for some magnetoelectric switching capacitors), $V_{DD}$ values having a magnitude of 200 mV would need to be applied to the MTJs. In some embodiments, a desired $V_{out}$ swing can be achieved through design of the MTJs. MTJs with a large TMR can result in a large $V_{out}$ swing.

The short-circuit current $I_{sc}$ through the MTJs from one of the MTJ electrodes (e.g., electrode 144 of MTJ 108) to the other MTJ electrode (e.g., electrode 148 of MTJ 110) is $$I_{sc} = \pm\left(\frac{1}{R_P} - \frac{1}{R_{AP}}\right)V_{DD} \qquad \text{Eq. 2}$$

Figure 1D:
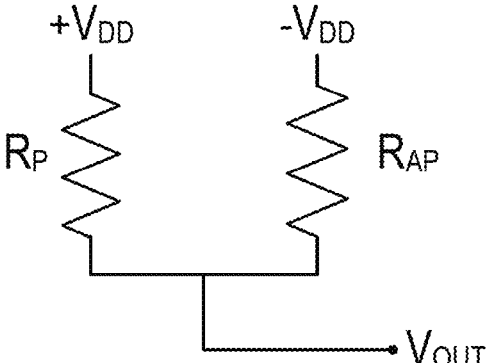
FIG. 1D illustrates an equivalent circuit of an example MTJ output module of a MEMTJ.

FIG. 1D illustrates an equivalent circuit of an example MTJ output module of a MEMTJ.

The magnetization orientations of the various layers in the MEMTJ illustrated in FIGS. 1A-1D are in-plane as the magnetization vectors are substantially parallel to top and bottom surfaces of a layer (e.g., top surface 156 and bottom surface 160 of ferromagnetic layer 128). For example, the horizontal orientations of the magnetization layers in MEMTJ 100 are oriented along the x-axis (that is, the horizontal orientations are leftward and rightward), which is the axis along which surfaces of MEMTJs are aligned. In other embodiments, the magnetization orientation of one or more layers of a MEMTJ can be perpendicular to surfaces of MTJ layers. For example, in some embodiments, the magnetization orientation of the reference layers 136 and 140 of the MTJs can be perpendicular to the top and bottom surfaces of the reference layers 136 and 140, and the magnetization of the reference layers 136 and 140 would thus be represented as being oriented vertically upward or downward along the z-axis in FIG. 1A.

Although the MTJs 108 and 110 are illustrated as being arranged substantially equidistant from the output electrode 152, in other embodiments, the MTJs of a MEMTJ can be spaced unequally from the output electrode. For example, in some embodiments, the two MTJs are arranged substantially along an axis extending from the input electrode (e.g., 164) to the output electrode (e.g., 152). FIG. 1C illustrates a cross-sectional view of a variation of the MEMTJ of FIG. 1B with the MTJs arranged along an axis extending from the MEMTJ input electrode 164 to the MEMTJ output electrode 152. A MEMTJ having MTJs arranged as illustrated in FIG. 1C can have a narrower width (y-dimension) relative to MEMTJs in which the MTJs are spaced substantially equidistant from the output electrode, such as illustrated in FIG. 1A.

The MEMTJ 100 is inverting as a positive input voltage $V_{in}$ results in a negative output voltage. In some embodiments, the input voltage is applied to the electrode positioned opposite to the ferromagnetic layer (e.g., electrode 164) and the electrode positioned adjacent to the same surface of the magnetoelectric layer (e.g., 120) as the ferromagnetic layer (e.g., 124) of the magnetoelectric capacitor (e.g., electrode 164) is tied to ground, making the MEMTJ non-inverting. In an inverting MEMTJ, a positive input voltage establishes a leftward magnetization orientation in the magnetoelectric layer 120 and the ferromagnetic layers 124, 128, and 130, and the potential of the ferromagnetic layers 128 and 130 and the electrode 152 are closer to the supply voltage supplied to the MTJ 110 ($-V_{DD}$) than the supply voltage supplied to the MTJ 108. Similarly, the application of a negative input voltage to the inverting MEMTJ results in an output voltage that is closer to the supply voltage ($+V_{DD}$) supplied to the MTJ 108 than the supply voltage supplied to the MTJ 110. In some embodiments, inverting and non-inverting MEMTJs can be realized by the orientations of the reference ferromagnetic layers and/or the voltages applied to the reference ferromagnetic layers. That is, an inverting MEMTJ can be made a non-inverting MEMTJ by switching the polarity of the supply voltages applied to the reference ferromagnetic layers of the MTJs or by fabricating a MEMTJ with MTJ reference layers having magnetization orientations opposite to that of the reference ferromagnetic layers in the MTJs of the inverting MEMTJ.

With output voltage amplitudes that can exceed the voltage needed to switch the state of another MEMTJ, the MEMTJ 100 is cascadable and the output of the MEMTJ 100 can be connected to the input of a succeeding MEMTJ to create a logic chain. Multiple inverting MEMTJs can be connected to create an inverter chain. An output electrode of a first MEMTJ can be connected to the input electrode of a second MEMTJ by a single via or a combination of one or more vias and one or more interconnects.

The magnetoelectric layer 120 can comprise any suitable magnetoelectric and/or multiferroic material (e.g., a multiferroic oxide), such as a material that includes, for example, bismuth (Bi), iron (Fe), oxygen (O), lanthanum (La), chromium (Cr), and/or boron (B), such as bismuth iron oxide (BiFeO₃ or BFO), doped bismuth iron oxide (e.g., BiFeO₃ doped with lanthanum, (($Bi_{1-x}$ $La_x$)FeO₃ or LBFO), chromium oxide ($Cr_2O_3$), and doped chromium oxide (e.g., $Cr_2O_3$ doped with boron). In some embodiments, the thickness of the magnetoelectric layer 120 may range from 1-100 nanometers (nm).

The ferromagnetic layers (124, 128, 130, 136, 140) can comprise any suitable conducting ferromagnetic material, such as cobalt, iron, nickel, or an alloy of conducting ferromagnetic material, such as CoFe, CoFeB, and NiFe, as well as ferromagnetic oxides, such as $Sr_2FeMoO_6$ (SFMO), $Sr_2CrReO_6$ (SCRO), $La_{0.7}Sr_{0.3}MnO_3$ (LSMO), and $Fe_3O_4$. The utilization of a ferromagnetic oxide as the ferromagnetic layer in the magnetoelectric capacitor 104 (ferromagnetic layer 124) can provide an improved interface with the magnetoelectric layer over interfaces provided by non-oxide ferromagnetic layers. The use of a ferromagnetic oxide as the ferromagnetic layer in the magnetoelectric capacitor can provide, for example, MEMTJs with improved endurance, leakage, and resistance to data imprinting, while still preserving a high TMR in the MTJs. In some embodiments where the magnetoelectric layer is $BiFeO_3$, the input electrode 116 comprises a material comprising strontium (Sr), ruthenium (Ru), and oxygen, such as $SrRuO_3$ (SRO), which can provide for better growth of $BiFeO_3$ during MEMTJ fabrication. In some embodiments, the thickness of the ferromagnetic layers 124, 128, 130, 136, and 140 is in the range of 1-5 nanometers (nm).

The conductive layer 122 can comprise any conductive material, such as ruthenium, tantalum, another metal, or an alloy. The use of a conductive material for the conductive layer provides for low series resistance between the free layers of the MTJs and the output of the MEMTJ. In some embodiments, the thickness of the conductive layer is in the range of 1-5 nanometers (nm).

In some embodiments, the MTJ insulating layers 132 and 134 comprise a material comprising magnesium, aluminum, and/or oxygen, such as magnesium oxide (MgO) or aluminum oxide ($Al_2O_3$). In some embodiments, the thickness of the MTJ insulating layers 132 and 134 is in the range of 0.5-3.0 nanometers (nm).

In some embodiments, the individual electrodes 116, 144, 148, 152, and 164 can be any suitable material, such as copper, aluminum, or another conductive material. In some embodiments, the MTJ electrodes 144 and 148 can comprise a stack of one or more layers with individual layers comprising ruthenium or tantalum. In other embodiments, the MTJ electrodes 144 and 148 can comprise a stack of one or more layers with individual layers comprising tantalum or tungsten. In some embodiments, the thicknesses of the electrodes 116, 144, 148, 152, and 164 are in the range of 1-500 nanometers (nm).

Figure 2:
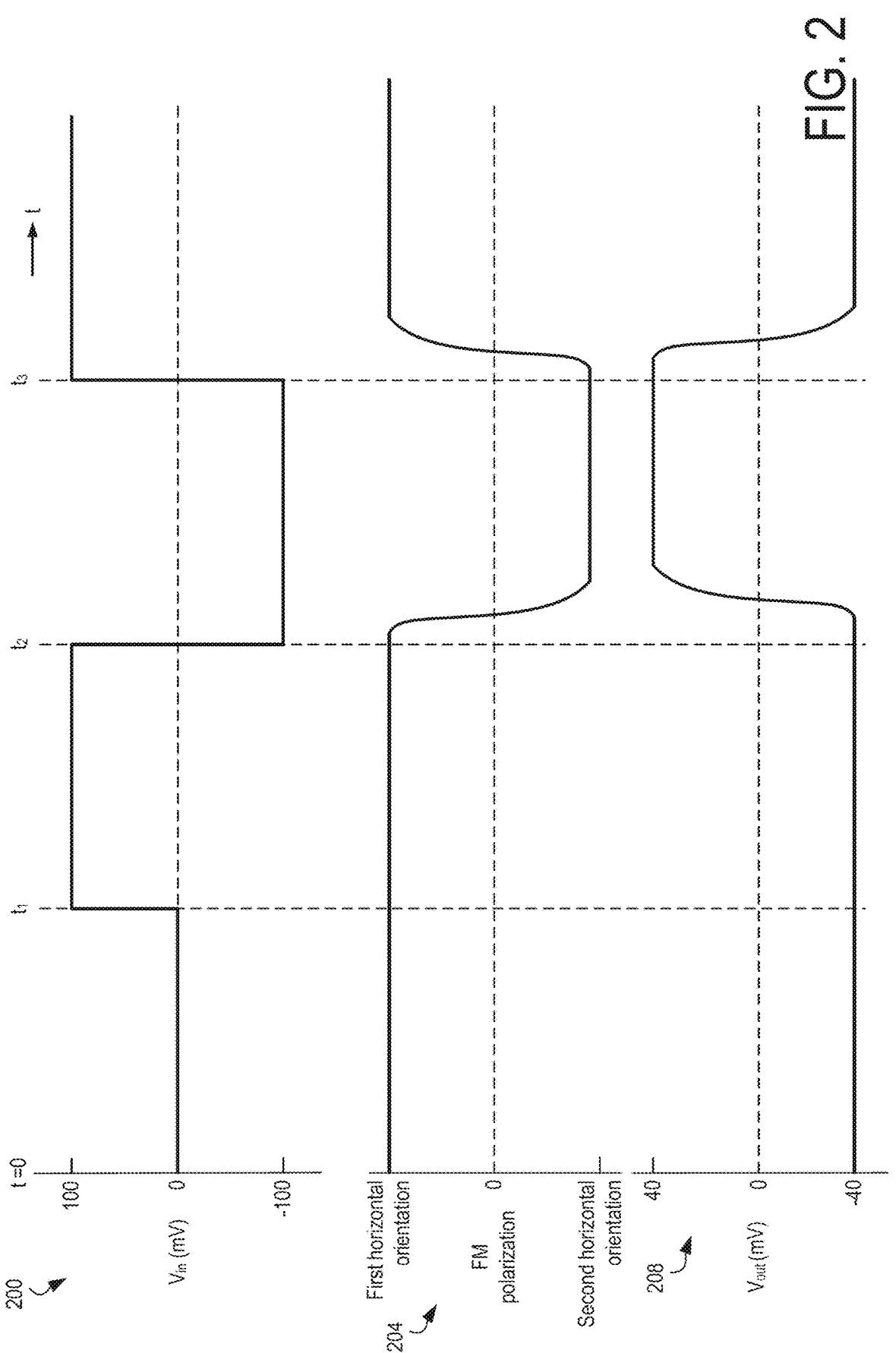
FIG. 2 illustrates voltage and magnetization orientation waveforms for the example MEMTJ of FIG. 1A.

FIG. 2 illustrates voltage and magnetization orientation waveforms for the example MEMTJ illustrated in FIGS. 1A-1B. Graph 200 illustrates an input voltage $V_{in}$ applied to the MEMTJ 100 over time and graphs 204 and 208 illustrate the orientation of the magnetization of the ferromagnetic layers 124, 128, and 130 and the MEMTJ output voltage $V_{out}$, respectively, over time. At time t=0, $V_{in}$ is at ground and the magnetization of the MEMTJ 100 internal ferromagnetic layers (the ferromagnetic free layers 128 and 130 of the MTJs and the ferromagnetic layer 124 of the magnetoelectric capacitor) are in a first horizontal orientation. In addition, the $+V_{DD}$ and $-V_{DD}$ supply voltages applied to electrodes 144 and 148 of MTJs 108 and 110, respectively, are set to +100 mV and −100 mV. MTJ 110 is in its low resistance state and MTJ 108 is in its high resistance state and $V_{out}$ is −40 mV. At time $t_1$, $V_{in}$ begins to toggle between positive and negative pulses having a 100 mV amplitude. As the application of a positive input voltage induces the first horizontal magnetization orientation the magnetization of the ferromagnetic layers in graph 204 does not change. At time t2, in response to yin switching to −100 mV, a second horizontal magnetization orientation is induced in the internal ferromagnetic layers, the magnetization orientation of the internal ferromagnetic layers switches from leftward to rightward, MTJ 108 switches to its low resistance state, MTJ 110 switches to its high resistance state, and Vout switches from −40 mV to +40 mV. At time $t_3$, $V_{in}$ switches back to +100 mV, causing the magnetization orientation of the internal ferromagnetic layers to switch back to the first horizontal magnetization orientation, and $V_{out}$ switches from +40 mV to −40 mV.

Figure 3:
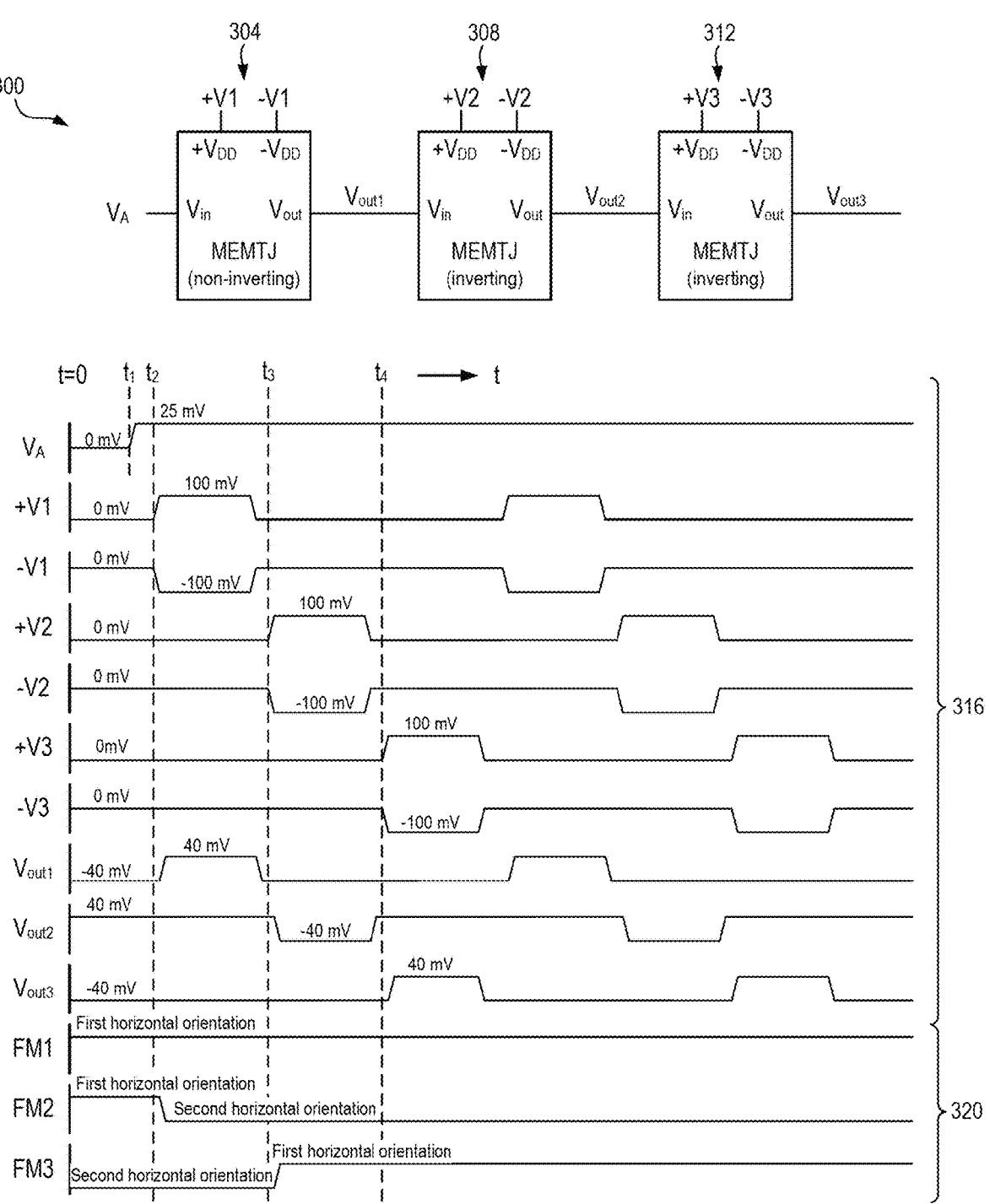
FIG. 3 illustrates voltage and magnetization orientation waveforms of an example three-stage MEMTJ logic chain.

FIG. 3 illustrates voltage and magnetization orientation waveforms of an example three-stage MEMTJ logic chain. The chain 300 comprises MEMTJs 304, 308, and 312 connected in series. The first MEMTJ 304 is a non-inverting MEMTJ and the second and third MEMTJs 308 and 312 are inverting MEMTJs. Graphs 316 illustrate input, output, and power supply voltage waveforms for the logic chain 300 and graphs 320 illustrate magnetization orientation waveforms for the internal ferromagnetic layers of the MEMTJs (FM1 for the ferromagnetic layers of the first MEMTJ stage, FM2 for the ferromagnetic layers of the second MEMTJ stage, FM3 for the ferromagnetic layers of the third MEMTJ stage). An input voltage $V_A$ is applied to the input of the first MEMTJ stage 304 and successive MTJ power supply pulses are applied to the individual MEMTJ stages to read out the logic state of the individual MEMTJs.

At t=0, $V_A$ is 0 mV and the magnetization orientations of the internal ferromagnetic layers of MEMTJ stages 304, 308, and 312 are in a first horizontal orientation, the first horizontal orientation, and a second horizontal orientation (opposite to the first horizontal orientation), respectively. At time $t_1$, $V_A$ switches to 25 mV, which induces the magnetization of the internal ferromagnetic layers of MEMTJ 304 to orient in the first horizontal orientation. Since the internal ferromagnetic layers of MEMTJ 304 are already oriented in the first horizontal orientation, there is no change in the logic state of the MEMTJ 304 in response to $V_A$ switching from 0 mV to 25 mV. As the power supply voltages +V1 and −V1 are set to 0 mV, the logic state of the first MEMTJ stage 304 has not yet been propagated to the stage output. At time t2, +V1 and −V1 power supply voltage pulses with 100 mV amplitude are applied to the first MEMTJ stage, causing the logic state of the first MEMTJ stage to be read out for the duration of the +V1 and −V1 pulses. The output of the first MEMTJ stage 304, $V_{out1}$, switches state from −40 mV to 40 mV for the duration of the power supply pulses and causes the magnetization orientation of the internal ferromagnetic layers of the second MEMTJ stage 308 to switch from the first horizontal orientation to the second horizontal orientation. The changed logic state of the second MEMTJ persists after cessation of the +V1 and −V1 power supply pulses. At time $t_3$, +V2 and −V2 power supply voltage pulses with 100 mV amplitude are applied to the second MEMTJ stage 308, causing the logic state of the second MEMTJ stage 308 to be read out. The output of the second MEMTJ stage 308, V oil e, switches state from +40 mV to −40 mV and causes the magnetization orientation of the internal ferromagnetic layers of the third MEMTJ stage 312 to switch from the second horizontal orientation to the first horizontal orientation. At time $t_4$, +V3 and −V3 power supply voltage pulses with 100 mV amplitude are applied to the third MEMTJ stage 312, causing the logic state of the third MEMTJ stage 312 to be read out. The output of the third MEMTJ stage 312, $V_{out3}$, switches state from −40 mV to +40 mV for as long as the power supply voltages pulses are applied to the third MEMTJ stage 312.

Power supply pulses applied after time $t_4$ cause the internal state of the corresponding MEMTJ to be read out for the duration of the power supply pulses, but with no further changes in $V_A$ after $t_1$, the logic states of the MEMTJ remain unchanged after $t_4$.

In some embodiments, a pass transistor or other circuitry can control the delivery of power supply voltages to the MTJs of a MEMTJ. The pass transistor or other circuitry can be controlled by a clock signal or other control signal. MEMTJs controlled as such can be used as dynamic logic stages.

Figure 4:
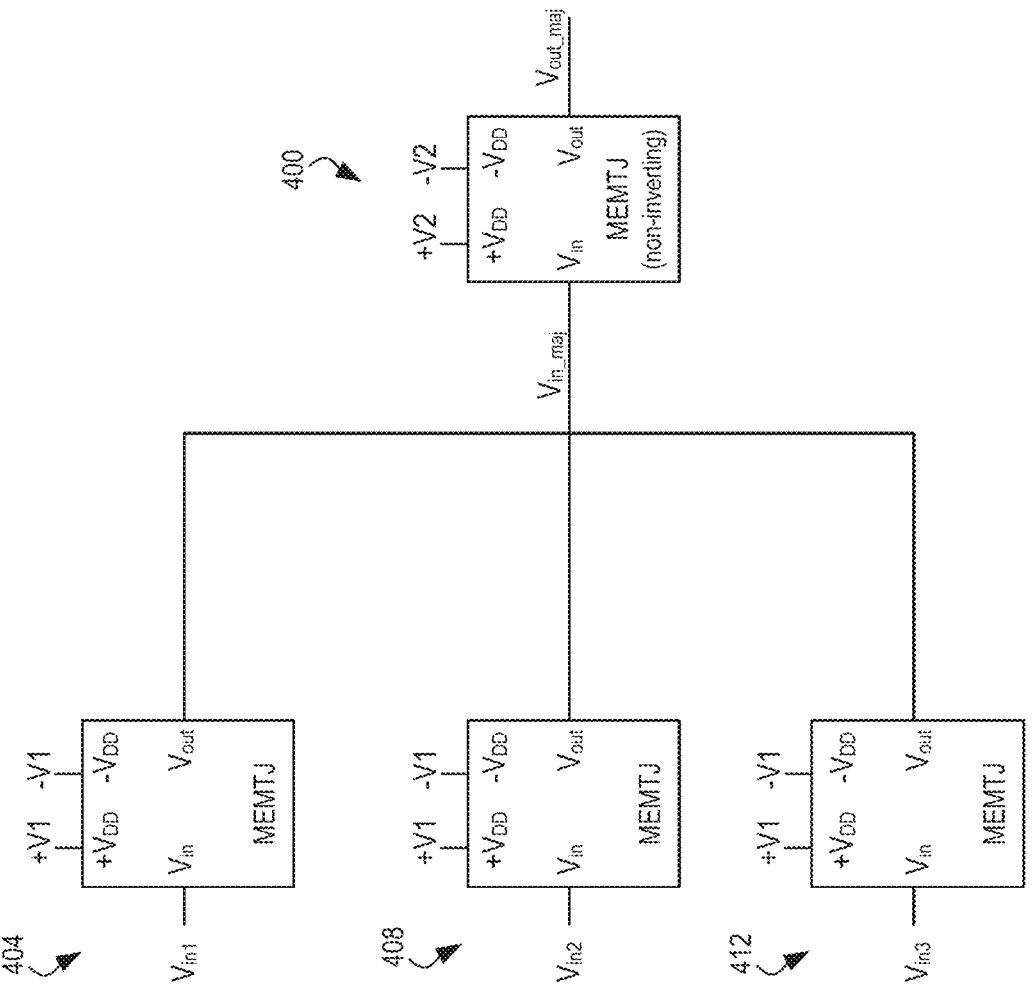
FIG. 4 illustrates an example majority logic gate implemented utilizing MEMTJs.

FIG. 4 illustrates an example majority logic gate utilizing MEMTJs. A majority gate is a logic gate in which the output is true (output voltage is positive in the case of MEMTJs described herein) if more than half of the inputs to the majority gate are true (input voltage is positive) and the output is false (output voltage is negative) if more than half of the inputs are false (input voltage is negative). The input of majority gate 400, $V_{in\_maj}$, is connected to the outputs of MEMTJs 404, 408, and 412. The output of the majority gate 400, $V_{out\_maj}$, will be positive if $V_{in\_maj}$ is greater than the switching voltage of the magnetoelectric capacitor of MEMTJ 400. This will occur if all three outputs of MEMTJs 404, 408, and 412 are positive or if two of the outputs of MEMTJs 404, 408, and 412 are positive and the value of $V_{in\_maj}$ when two of the outputs are positive is greater than the magnetoelectric capacitor switching voltage of the MEMTJ 400. The addition of an inverting MEMTJ to the output of the majority gate 400 would yield an output that implements a minority logic function.

The MEMTJs disclosed herein can be used in any processor unit, integrated circuit component, or computing system described or referenced herein. MEMTJs can be fabricated as part of an integrated circuit structure. The integrated circuit structure can comprise a die substrate, such as a die substrate comprising silicon, and one or more interconnect layers. An electrode of a MEMTJ can connect to lines of an interconnect layer by a via or by being positioned adjacent to an interconnect layer line. The integrated circuit structure can comprise other types of devices, such as electronic transistors (e.g., CMOS) transistors and a MEMTJ can connect to other MEMTJs or other device types in the integrated circuit structure by one or more of the interconnect layers or by being directly connected to another MEMTJ or other device type.

An integrated circuit component comprising one or more MEMTJs as disclosed herein can be attached to a printed circuit board. In some embodiments, one or more additional integrated circuit components can be attached to the circuit board. In some embodiments, the printed circuit board and the integrated circuit component can be located in a computing device that comprises a housing that encloses the printed circuit board and the integrated circuit component.

FIG. 5 is an example method of forming a MEMTJ. At 504, a magnetoelectric capacitor is formed on an integrated circuit structure, the magnetoelectric capacitor comprising a first electrode, a first ferromagnetic layer, and a magnetoelectric layer positioned between the first electrode and the first ferromagnetic layer. At 508, a second electrode is formed, the second electrode positioned adjacent to the magnetoelectric layer. At 512, a conductive layer positioned adjacent to the first ferromagnetic layer is formed. At 516, a first magnetic tunnel junction is formed, the first magnetic tunnel junction comprising a second ferromagnetic layer, a third ferromagnetic layer, and a first insulating layer positioned between the second ferromagnetic layer and the third ferromagnetic layer, the third ferromagnetic layer positioned adjacent to the conductive layer. At 520, a second magnetic tunnel junction is formed, the second magnetic tunnel junction comprising a fourth ferromagnetic layer, a fifth ferromagnetic layer, and a second insulating layer positioned between the fourth ferromagnetic layer and the fifth ferromagnetic layer, the fifth ferromagnetic layer positioned adjacent to the conductive layer.

The MEMTJs described herein can be implemented in any of a variety of computing systems, including mobile computing systems (e.g., smartphones, handheld computers, tablet computers, laptop computers, portable gaming consoles, 2-in-1 convertible computers, portable all-in-one computers), non-mobile computing systems (e.g., desktop computers, servers, workstations, stationary gaming consoles, set-top boxes, smart televisions, rack-level computing solutions (e.g., blade, tray, or sled computing systems)), and embedded computing systems (e.g., computing systems that are part of a vehicle, smart home appliance, consumer electronics product or equipment, manufacturing equipment). As used herein, the term "computing system" includes computing devices and includes systems comprising multiple discrete physical components. In some embodiments, the computing systems are located in a data center, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

Figure 6:
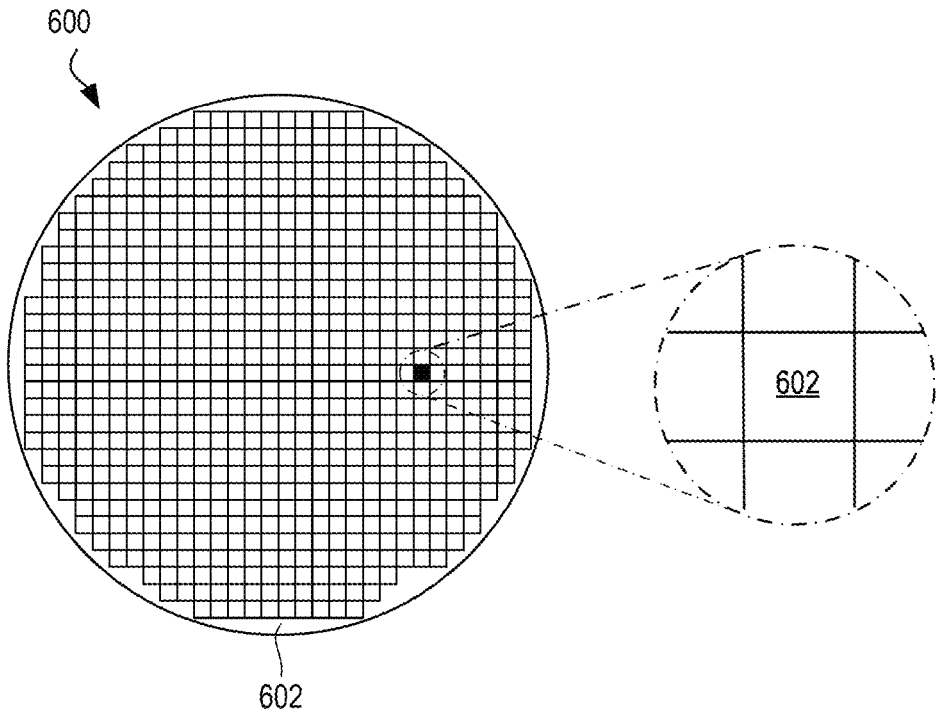
FIG. 6 is a top view of a wafer and dies that may be included in a microelectronic assembly, in accordance with any of the embodiments disclosed herein.

FIG. 6 is a top view of a wafer 600 and dies 602 that may include any of the MEMTJs described herein. The wafer 600 may be composed of semiconductor material and may include one or more dies 602 having integrated circuit structures formed on a surface of the wafer 600. The individual dies 602 may be a repeating unit of an integrated circuit product that includes any suitable integrated circuit. After the fabrication of the semiconductor product is complete, the wafer 600 may undergo a singulation process in which the dies 602 are separated from one another to provide discrete "chips" of the integrated circuit product. The die 602 may include one or more transistors (e.g., some of the transistors 740 of FIG. 7, discussed below), supporting circuitry to route electrical signals to the transistors, passive components (e.g., signal traces, resistors, capacitors, or inductors), and/or any other integrated circuit components. In some embodiments, the wafer 600 or the die 602 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processor unit (e.g., the processor unit 1002 of FIG. 10) or other logic that is configured to store information in the memory devices or execute instructions stored in the memory array. Various ones of the microelectronic assemblies disclosed herein may be manufactured using a die-to-wafer assembly technique in which some dies are attached to a wafer 600, and the wafer 600 is subsequently singulated.

Figure 7:
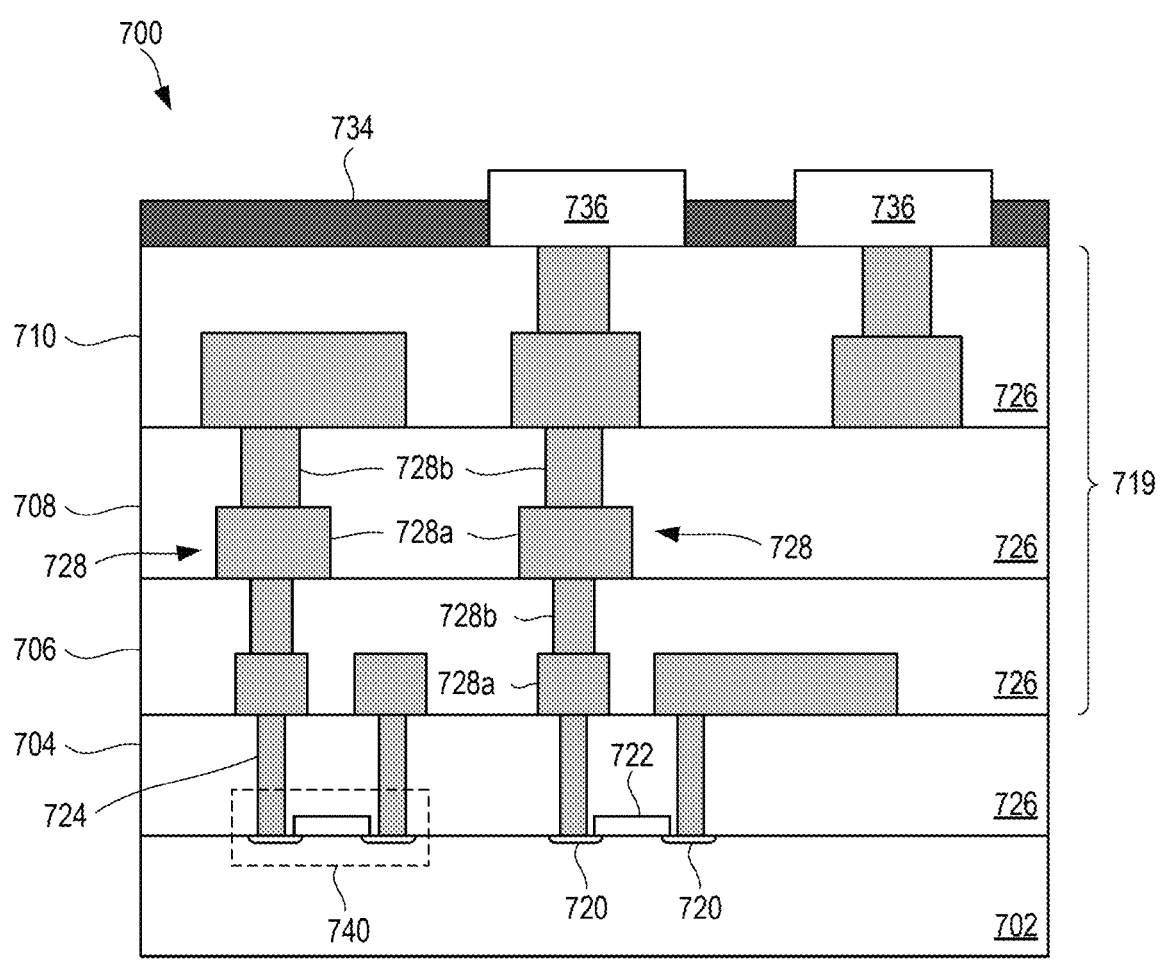
FIG. 7 is a cross-sectional side view of an integrated circuit device that may be included in a microelectronic assembly, in accordance with any of the embodiments disclosed herein.

FIG. 7 is a cross-sectional side view of an integrated circuit device 700 that may include any of the MEMTJs disclosed herein. One or more of the integrated circuit devices 700 may be included in one or more dies 602 (FIG. 6). The integrated circuit device 700 may be formed on a die substrate 702 (e.g., the wafer 600 of FIG. 6) and may be included in a die (e.g., the die 602 of FIG. 6). The die substrate 702 may be a semiconductor substrate composed of semiconductor material systems including, for example, n-type or p-type materials systems (or a combination of both). The die substrate 702 may include, for example, a crystalline substrate formed using a bulk silicon or a silicon-on-insulator (SOI) substructure. In some embodiments, the die substrate 702 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 702. Although a few examples of materials from which the die substrate 702 may be formed are described here, any material that may serve as a foundation for an integrated circuit device 700 may be used. The die substrate 702 may be part of a singulated die (e.g., the dies 602 of FIG. 6) or a wafer (e.g., the wafer 600 of FIG. 6).

The integrated circuit device 700 may include one or more device layers 704 disposed on the die substrate 702. The device layer 704 may include features of one or more transistors 740 (e.g., metal oxide semiconductor field-effect transistors (MOSFETs)) formed on the die substrate 702. The transistors 740 may include, for example, one or more source and/or drain (S/D) regions 720, a gate 722 to control current flow between the S/D regions 720, and one or more S/D contacts 724 to route electrical signals to/from the S/D regions 720. The transistors 740 may include additional features not depicted for the sake of clarity, such as device isolation regions, gate contacts, and the like. The transistors 740 are not limited to the type and configuration depicted in FIG. 7 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 8A-8D are simplified perspective views of example planar, FinFET, gate-all-around, and stacked gate-all-around transistors. The transistors illustrated in FIGS. 8A-8D are formed on a substrate 816 having a surface 808. Isolation regions 814 separate the source and drain regions of the transistors from other transistors and from a bulk region 818 of the substrate 816.

Figures 8A, 8B, 8C, 8D:
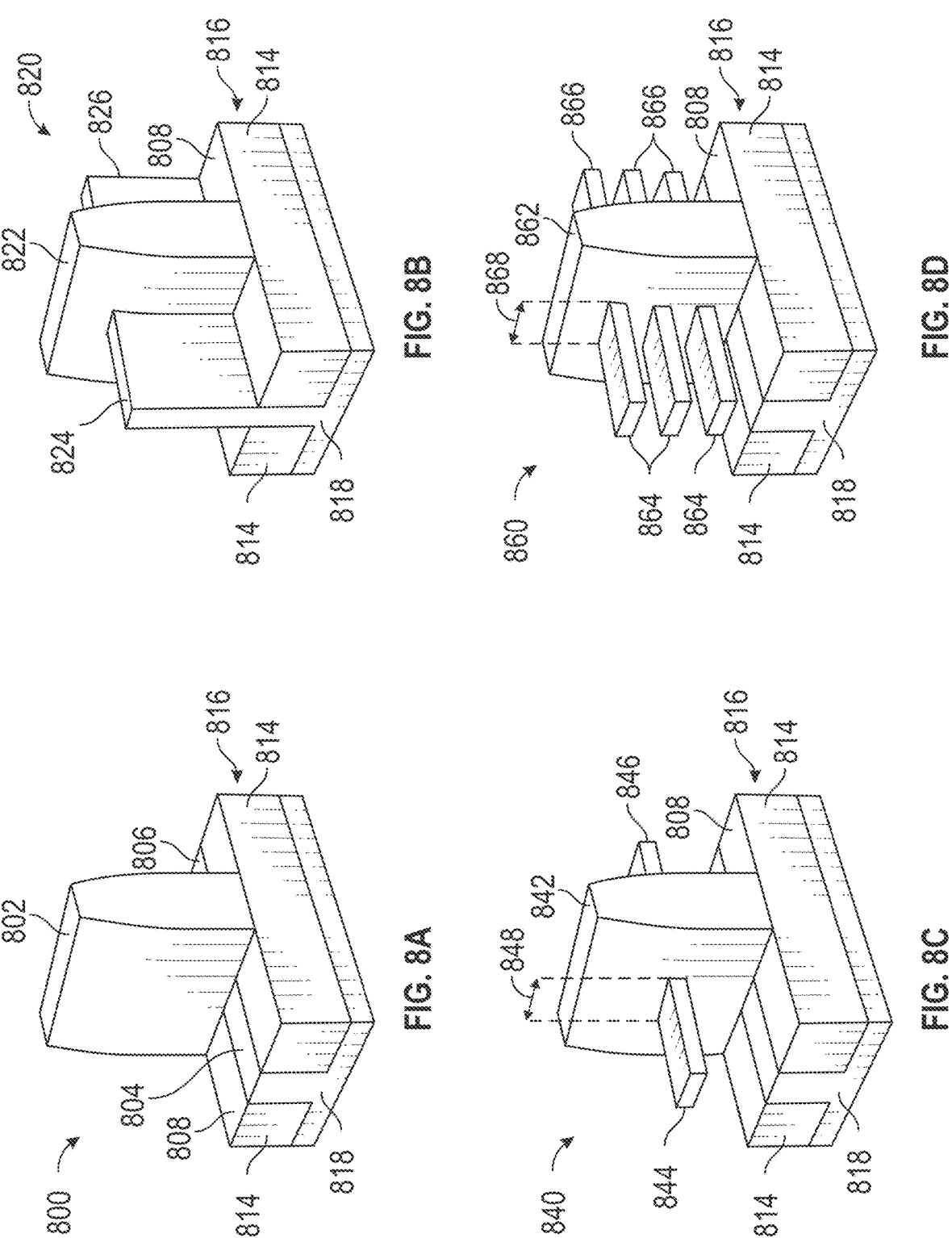
FIGS. 8A-8D are perspective views of example planar, FinFET, gate-all-around, and stacked gate-all-around transistors.

FIG. 8A is a perspective view of an example planar transistor 800 comprising a gate 802 that controls current flow between a source region 804 and a drain region 806. The transistor 800 is planar in that the source region 804 and the drain region 806 are planar with respect to the substrate surface 808.

FIG. 8B is a perspective view of an example FinFET transistor 820 comprising a gate 822 that controls current flow between a source region 824 and a drain region 826. The transistor 820 is non-planar in that the source region 824 and the drain region 826 comprise "fins" that extend upwards from the substrate surface 808. As the gate 822 encompasses three sides of the semiconductor fin that extends from the source region 824 to the drain region 826, the transistor 820 can be considered a tri-gate transistor. FIG. 8B illustrates one S/D fin extending through the gate 822, but multiple S/D fins can extend through the gate of a FinFET transistor.

FIG. 8C is a perspective view of a gate-all-around (GAA) transistor 840 comprising a gate 842 that controls current flow between a source region 844 and a drain region 846. The transistor 840 is non-planar in that the source region 844 and the drain region 846 are elevated from the substrate surface 808.

FIG. 8D is a perspective view of a GAA transistor 860 comprising a gate 862 that controls current flow between multiple elevated source regions 864 and multiple elevated drain regions 866. The transistor 860 is a stacked GAA transistor as the gate controls the flow of current between multiple elevated S/D regions stacked on top of each other. The transistors 840 and 860 are considered gate-all-around transistors as the gates encompass all sides of the semiconductor portions that extend from the source regions to the drain regions. The transistors 840 and 860 can alternatively be referred to as nanowire, nanosheet, or nanoribbon transistors depending on the width (e.g., widths 848 and 868 of transistors 840 and 860, respectively) of the semiconductor portions extending through the gate.

Returning to FIG. 7, a transistor 740 may include a gate 722 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 740 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 740 along the source-channel-drain direction, the gate electrode may consist of a U-shaped structure that includes a bottom portion substantially parallel to the surface of the die substrate 702 and two sidewall portions that are substantially perpendicular to the top surface of the die substrate 702. In other embodiments, at least one of the metal layers that form the gate electrode may simply be a planar layer that is substantially parallel to the top surface of the die substrate 702 and does not include sidewall portions substantially perpendicular to the top surface of the die substrate 702. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 720 may be formed within the die substrate 702 adjacent to the gate 722 of individual transistors 740. The S/D regions 720 may be formed using an implantation/diffusion process or an etching/deposition process, for example. In the former process, dopants such as boron, aluminum, antimony, phosphorous, or arsenic may be ion-implanted into the die substrate 702 to form the S/D regions 720. An annealing process that activates the dopants and causes them to diffuse farther into the die substrate 702 may follow the ion-implantation process. In the latter process, the die substrate 702 may first be etched to form recesses at the locations of the S/D regions 720. An epitaxial deposition process may then be carried out to fill the recesses with material that is used to fabricate the S/D regions 720. In some implementations, the S/D regions 720 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 720 may be formed using one or more alternate semiconductor materials such as germanium or a group III-V material or alloy. In further embodiments, one or more layers of metal and/or metal alloys may be used to form the S/D regions 720.

Electrical signals, such as power and/or input/output (I/O) signals, may be routed to and/or from the devices (e.g., transistors 740) of the device layer 704 through one or more interconnect layers disposed on the device layer 704 (illustrated in FIG. 7 as interconnect layers 706-710). For example, electrically conductive features of the device layer 704 (e.g., the gate 722 and the S/D contacts 724) may be conductively coupled with the interconnect structures 728 of the interconnect layers 706-710. The one or more interconnect layers 706-710 may form a metallization stack (also referred to as an "ILD stack") 719 of the integrated circuit device 700.

The interconnect structures 728 may be arranged within the interconnect layers 706-710 to route electrical signals according to a wide variety of designs; in particular, the arrangement is not limited to the particular configuration of interconnect structures 728 depicted in FIG. 7. Although a particular number of interconnect layers 706-710 is depicted in FIG. 7, embodiments of the present disclosure include integrated circuit devices having more or fewer interconnect layers than depicted.

In some embodiments, the interconnect structures 728 may include lines 728a and/or vias 728b filled with an electrically conductive material such as a metal. The lines 728a may be arranged to route electrical signals in a direction of a plane that is substantially parallel with a surface of the die substrate 702 upon which the device layer 704 is formed. For example, the lines 728a may route electrical signals in a direction in and out of the page and/or in a direction across the page from the perspective of FIG.

7. The vias 728b may be arranged to route electrical signals in a direction of a plane that is substantially perpendicular to the surface of the die substrate 702 upon which the device layer 704 is formed. In some embodiments, the vias 728b may electrically couple lines 728a of different interconnect layers 706-710 together.

The interconnect layers 706-710 may include a dielectric material 726 disposed between the interconnect structures 728, as shown in FIG. 7. In some embodiments, dielectric material 726 disposed between the interconnect structures 728 in different ones of the interconnect layers 706-710 may have different compositions; in other embodiments, the composition of the dielectric material 726 between different interconnect layers 706-710 may be the same. The device layer 704 may include a dielectric material 726 disposed between the transistors 740 and a bottom layer of the metallization stack as well. The dielectric material 726 included in the device layer 704 may have a different composition than the dielectric material 726 included in the interconnect layers 706-710; in other embodiments, the composition of the dielectric material 726 in the device layer 704 may be the same as a dielectric material 726 included in any one of the interconnect layers 706-710.

A first interconnect layer 706 (referred to as Metal 1 or "M1") may be formed directly on the device layer 704. In some embodiments, the first interconnect layer 706 may include lines 728a and/or vias 728b, as shown. The lines 728a of the first interconnect layer 706 may be coupled with contacts (e.g., the S/D contacts 724) of the device layer 704. The vias 728b of the first interconnect layer 706 may be coupled with the lines 728a of a second interconnect layer 708.

The second interconnect layer 708 (referred to as Metal 2 or "M2") may be formed directly on the first interconnect layer 706. In some embodiments, the second interconnect layer 708 may include via 728b to couple the lines 728 of the second interconnect layer 708 with the lines 728a of a third interconnect layer 710. Although the lines 728a and the vias 728b are structurally delineated with a line within individual interconnect layers for the sake of clarity, the lines 728a and the vias 728b may be structurally and/or materially contiguous (e.g., simultaneously filled during a dual-damascene process) in some embodiments.

The third interconnect layer 710 (referred to as Metal 3 or "M3") (and additional interconnect layers, as desired) may be formed in succession on the second interconnect layer 708 according to similar techniques and configurations described in connection with the second interconnect layer 708 or the first interconnect layer 706. In some embodiments, the interconnect layers that are "higher up" in the metallization stack 719 in the integrated circuit device 700 (i.e., farther away from the device layer 704) may be thicker than the interconnect layers that are lower in the metallization stack 719, with lines 728a and vias 728b in the higher interconnect layers being thicker than those in the lower interconnect layers.

The integrated circuit device 700 may include a solder resist material 734 (e.g., polyimide or similar material) and one or more conductive contacts 736 formed on the interconnect layers 706-710. In FIG. 7, the conductive contacts 736 are illustrated as taking the form of bond pads. The conductive contacts 736 may be conductively coupled with the interconnect structures 728 and configured to route the electrical signals of the transistor(s) 740 to external devices. For example, solder bonds may be formed on the one or more conductive contacts 736 to mechanically and/or electrically couple an integrated circuit die including the integrated circuit device 700 with another component (e.g., a printed circuit board). The integrated circuit device 700 may include additional or alternate structures to route the electrical signals from the interconnect layers 706-710; for example, the conductive contacts 736 may include other analogous features (e.g., posts) that route the electrical signals to external components.

In some embodiments in which the integrated circuit device 700 is a double-sided die, the integrated circuit device 700 may include another metallization stack (not shown) on the opposite side of the device layer(s) 704. This metallization stack may include multiple interconnect layers as discussed above with reference to the interconnect layers 706-710, to provide conductive pathways (e.g., including conductive lines and vias) between the device layer(s) 704 and additional conductive contacts (not shown) on the opposite side of the integrated circuit device 700 from the conductive contacts 736.

In other embodiments in which the integrated circuit device 700 is a double-sided die, the integrated circuit device 700 may include one or more through silicon vias (TSVs) through the die substrate 702; these TSVs may make contact with the device layer(s) 704, and may provide conductive pathways between the device layer(s) 704 and additional conductive contacts (not shown) on the opposite side of the integrated circuit device 700 from the conductive contacts 736. In some embodiments, TSVs extending through the substrate can be used for routing power and ground signals from conductive contacts on the opposite side of the integrated circuit device 700 from the conductive contacts 736 to the transistors 740 and any other components integrated into the die 700, and the metallization stack 719 can be used to route I/O signals from the conductive contacts 736 to transistors 740 and any other components integrated into the die 700.

Multiple integrated circuit devices 700 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 9:
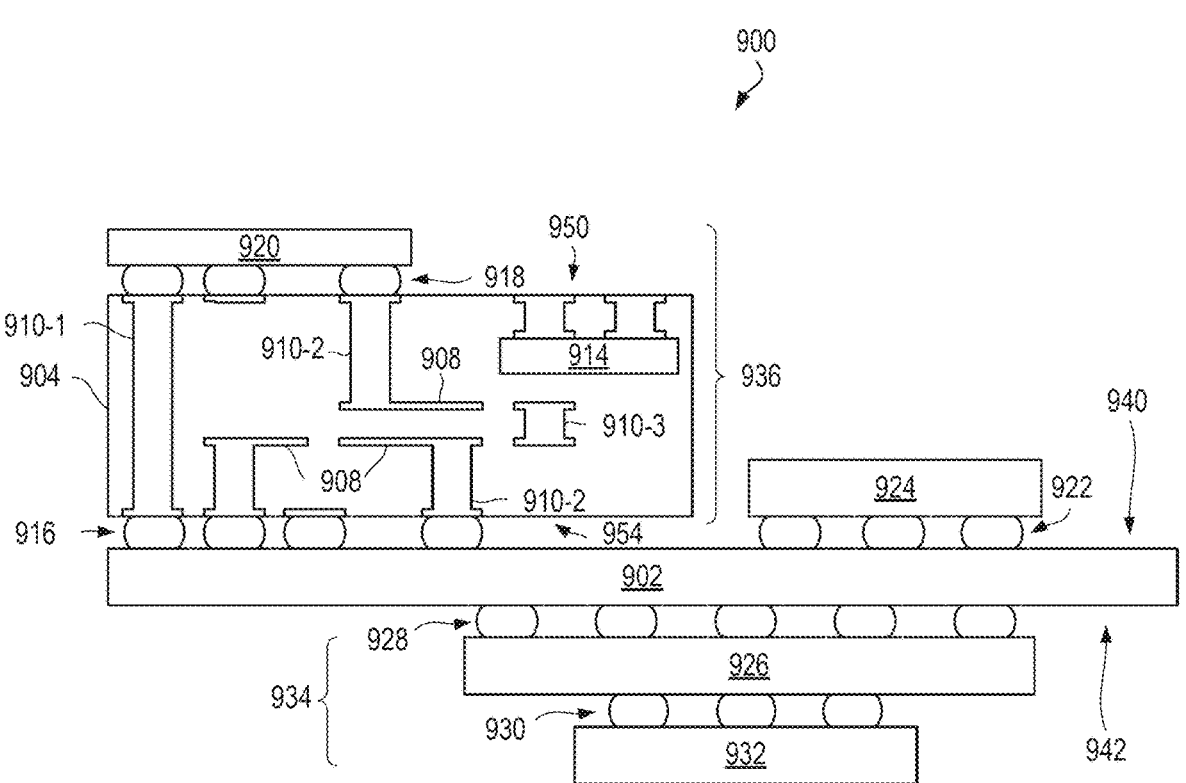
FIG. 9 is a cross-sectional side view of an integrated circuit device assembly that may include a microelectronic assembly, in accordance with any of the embodiments disclosed herein.

FIG. 9 is a cross-sectional side view of an integrated circuit device assembly 900 that may include any of the MEMTJs described herein. The integrated circuit device assembly 900 includes a number of components disposed on a circuit board 902 (which may be a motherboard, system board, mainboard, etc.). The integrated circuit device assembly 900 includes components disposed on a first face 940 of the circuit board 902 and an opposing second face 942 of the circuit board 902; generally, components may be disposed on one or both faces 940 and 942. Any of the integrated circuit components discussed below with reference to the integrated circuit device assembly 900 may take the form of any suitable ones of the embodiments of the microelectronic assemblies disclosed herein.

In some embodiments, the circuit board 902 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate. The integrated circuit device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 916 may serve as the coupling components illustrated or described for any of the substrate assembly or substrate assembly components described herein, as appropriate.

The package-on-interposer structure 936 may include an integrated circuit component 920 coupled to an interposer 904 by coupling components 918. The coupling components 918 may take any suitable form for the application, such as the forms discussed above with reference to the coupling components 916. Although a single integrated circuit component 920 is shown in FIG. 9, multiple integrated circuit components may be coupled to the interposer 904; indeed, additional interposers may be coupled to the interposer 904. The interposer 904 may provide an intervening substrate used to bridge the circuit board 902 and the integrated circuit component 920.

The integrated circuit component 920 may be a packaged or unpacked integrated circuit product that includes one or more integrated circuit dies (e.g., the die 602 of FIG. 6, the integrated circuit device 700 of FIG. 7) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 920, a single monolithic integrated circuit die comprises solder bumps attached to contacts on the die. The solder bumps allow the die to be directly attached to the interposer 904. The integrated circuit component 920 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 920 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 920 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 920 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 904 may spread connections to a wider pitch or reroute a connection to a different connection. For example, the interposer 904 may couple the integrated circuit component 920 to a set of ball grid array (BGA) conductive contacts of the coupling components 916 for coupling to the circuit board 902. In the embodiment illustrated in FIG. 9, the integrated circuit component 920 and the circuit board 902 are attached to opposing sides of the interposer 904; in other embodiments, the integrated circuit component 920 and the circuit board 902 may be attached to a same side of the interposer 904. In some embodiments, three or more components may be interconnected by way of the interposer 904.

In some embodiments, the interposer 904 may be formed as a PCB, including multiple metal layers separated from one another by layers of dielectric material and interconnected by electrically conductive vias. In some embodiments, the interposer 904 may be formed of an epoxy resin, a fiberglass-reinforced epoxy resin, an epoxy resin with inorganic fillers, a ceramic material, or a polymer material such as polyimide. In some embodiments, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias 910, including but not limited to through hole vias 910-1 (that extend from a first face 950 of the interposer 904 to a second face 954 of the interposer 904), blind vias 910-2 (that extend from the first or second faces 950 or 954 of the interposer 904 to an internal metal layer), and buried vias 910-3 (that connect internal metal layers).

In some embodiments, the interposer 904 can comprise a silicon interposer. Through silicon vias (TSV) extending through the silicon interposer can connect connections on a first face of a silicon interposer to an opposing second face of the silicon interposer. In some embodiments, an interposer 904 comprising a silicon interposer can further comprise one or more routing layers to route connections on a first face of the interposer 904 to an opposing second face of the interposer 904.

The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art.

The integrated circuit device assembly 900 may include an integrated circuit component 924 coupled to the first face 940 of the circuit board 902 by coupling components 922. The coupling components 922 may take the form of any of the embodiments discussed above with reference to the coupling components 916, and the integrated circuit component 924 may take the form of any of the embodiments discussed above with reference to the integrated circuit component 920.

The integrated circuit device assembly 900 illustrated in FIG. 9 includes a package-on-package structure 934 coupled to the second face 942 of the circuit board 902 by coupling components 928. The package-on-package structure 934 may include an integrated circuit component 926 and an integrated circuit component 932 coupled together by coupling components 930 such that the integrated circuit component 926 is disposed between the circuit board 902 and the integrated circuit component 932. The coupling components 928 and 930 may take the form of any of the embodiments of the coupling components 916 discussed above, and the integrated circuit components 926 and 932 may take the form of any of the embodiments of the integrated circuit component 920 discussed above. The package-on-package structure 934 may be configured in accordance with any of the package-on-package structures known in the art.

Figure 10:
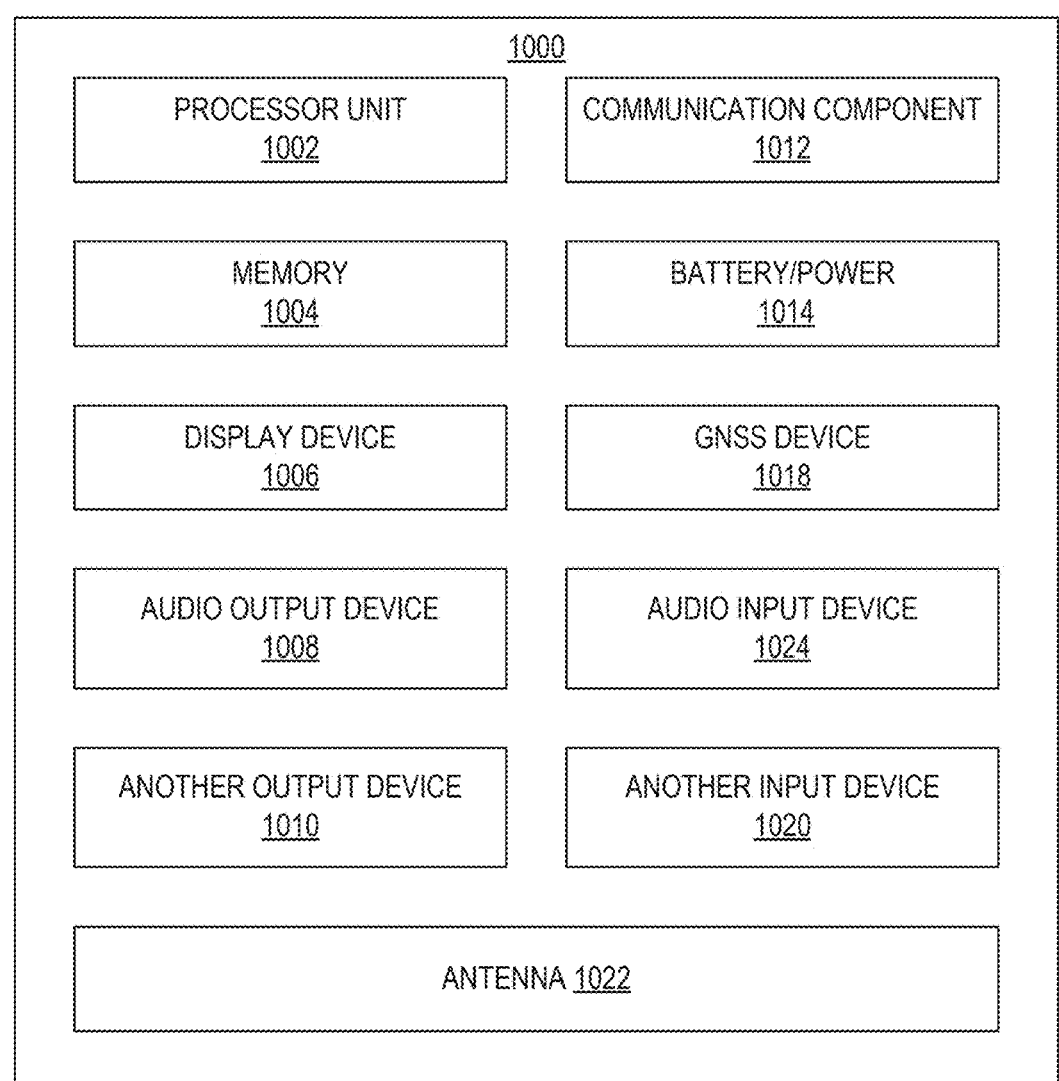
FIG. 10 is a block diagram of an example electrical device that may include a microelectronic assembly, in accordance with any of the embodiments disclosed herein.

FIG. 10 is a block diagram of an example electrical device 1000 that may include one or more of the MEMTJs disclosed herein. For example, any suitable ones of the components of the electrical device 1000 may include one or more of the integrated circuit device assemblies 900, integrated circuit components 920, integrated circuit devices 700, or integrated circuit dies 602 disclosed herein, and may be arranged in any of the microelectronic assemblies disclosed herein. A number of components are illustrated in FIG. 10 as included in the electrical device 1000, but any one or more of these components may be omitted or duplicated, as suitable for the application. In some embodiments, some or all of the components included in the electrical device 1000 may be attached to one or more motherboards, mainboards, or system boards. In some embodiments, one or more of these components are fabricated onto a single system-on-a-chip (SoC) die.

Additionally, in various embodiments, the electrical device 1000 may not include one or more of the components illustrated in FIG. 10, but the electrical device 1000 may include interface circuitry for coupling to the one or more components. For example, the electrical device 1000 may not include a display device 1006, but may include display device interface circuitry (e.g., a connector and driver circuitry) to which a display device 1006 may be coupled. In another set of examples, the electrical device 1000 may not include an audio input device 1024 or an audio output device 1008, but may include audio input or output device interface circuitry (e.g., connectors and supporting circuitry) to which an audio input device 1024 or audio output device 1008 may be coupled.

The electrical device 1000 may include one or more processor units 1002 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1002 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1000 may include a memory 1004, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-volatile memories), solid state memory, and/or a hard drive. In some embodiments, the memory 1004 may include memory that is located on the same integrated circuit die as the processor unit 1002. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1000 can comprise one or more processor units 1002 that are heterogeneous or asymmetric to another processor unit 1002 in the electrical device 1000. There can be a variety of differences between the processing units 1002 in a system in terms of a spectrum of metrics of merit including architectural, micro-architectural, thermal, power consumption characteristics, and the like. These differences can effectively manifest themselves as asymmetry and heterogeneity among the processor units 1002 in the electrical device 1000.

In some embodiments, the electrical device 1000 may include a communication component 1012 (e.g., one or more communication components). For example, the communication component 1012 can manage wireless communications for the transfer of data to and from the electrical device 1000. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1012 may operate in accordance with other wireless protocols in other embodiments. The electrical device 1000 may include an antenna 1022 to facilitate wireless communications and/or to receive other wireless communications (such as AM or FM radio transmissions).

In some embodiments, the communication component 1012 may manage wired communications, such as electrical, optical, or any other suitable communication protocols (e.g., IEEE 802.3 Ethernet standards). As noted above, the communication component 1012 may include multiple communication components. For instance, a first communication component 1012 may be dedicated to shorter-range wireless communications such as Wi-Fi or Bluetooth, and a second communication component 1012 may be dedicated to longer-range wireless communications such as global positioning system (GPS), EDGE, GPRS, CDMA, WiMAX, LTE, EV-DO, or others. In some embodiments, a first communication component 1012 may be dedicated to wireless communications, and a second communication component 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display device 1006 (or corresponding interface circuitry, as discussed above). The display device 1006 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any embedded or wired or wirelessly connected external device that generates an audible indicator, such speakers, headsets, or earbuds.

The electrical device 1000 may include an audio input device 1024 (or corresponding interface circuitry, as discussed above). The audio input device 1024 may include any embedded or wired or wirelessly connected device that generates a signal representative of a sound, such as microphones, microphone arrays, or digital instruments (e.g., instruments having a musical instrument digital interface (MIDI) output). The electrical device 1000 may include a Global Navigation Satellite System (GNSS) device 1018 (or corresponding interface circuitry, as discussed above), such as a Global Positioning System (GPS) device. The GNSS device 1018 may be in communication with a satellite-based system and may determine a geolocation of the electrical device 1000 based on information received from one or more GNSS satellites, as known in the art.

The electrical device 1000 may include another output device 1010 (or corresponding interface circuitry, as discussed above). Examples of the other output device 1010 may include an audio codec, a video codec, a printer, a wired or wireless transmitter for providing information to other devices, or an additional storage device.

The electrical device 1000 may include another input device 1020 (or corresponding interface circuitry, as discussed above). Examples of the other input device 1020 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1000 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1000 may be any other electronic device that processes data. In some embodiments, the electrical device 1000 may comprise multiple discrete physical components. Given the range of devices that the electrical device 1000 can be manifested as in various embodiments, in some embodiments, the electrical device 1000 can be referred to as a computing device or a computing system.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

As used in this application and the claims, the phrase "individual of" or "respective of" followed by a list of items recited or stated as having a trait, feature, etc. means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises sidewall, and C comprises a sidewall.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 includes an apparatus comprising a first electrode; a first ferromagnetic layer; a magnetoelectric layer positioned between the first electrode and the first ferromagnetic layer; a first magnetic tunnel junction comprising a second ferromagnetic layer; a third ferromagnetic layer; and a first insulating layer positioned between the second ferromagnetic layer and the third ferromagnetic layer; a second magnetic tunnel junction comprising a fourth ferromagnetic layer; a fifth ferromagnetic layer; and a second insulating layer positioned between the fourth ferromagnetic layer and the fifth ferromagnetic layer; and a conductive layer positioned between the first ferromagnetic layer and the second ferromagnetic layer and between the first ferromagnetic layer and the fourth ferromagnetic layer.

Example 2 includes the subject matter of Example 1, wherein the first electrode comprises strontium, ruthenium, and oxygen.

Example 3 includes the subject matter of Example 1 or 2, wherein the first ferromagnetic layer comprises oxygen.

Example 4 includes the subject matter of Example 1 or 2, wherein the first ferromagnetic layer comprises strontium, calcium, ruthenium, and oxygen.

Example 5 includes the subject matter of Example 1 or 2, wherein the first ferromagnetic layer comprises strontium, iron, molybdenum, and oxygen.

Example 6 includes the subject matter of Example 1 or 2, wherein the first ferromagnetic layer comprises lanthanum, strontium, manganese, and oxygen.

Example 7 includes the subject matter of Example 1 or 2, wherein the first ferromagnetic layer comprises iron and oxygen.

Example 8 includes the subject matter of any one of Examples 1-7, wherein the conductive layer comprises ruthenium.

Example 9 includes the subject matter of any one of Examples 1-7, wherein the conductive layer comprises tantalum.

Example 10 includes the subject matter of Example 1, wherein one or more of the first ferromagnetic layer, the second ferromagnetic layer, the third ferromagnetic layer, the fourth ferromagnetic layer, and the fifth ferromagnetic layer comprises iron, cobalt, and boron.

Example 11 includes the subject matter of Example 1, and wherein one or more of the first ferromagnetic layer, the second ferromagnetic layer, the third ferromagnetic layer, the fourth ferromagnetic layer, and the fifth ferromagnetic layer comprises iron and cobalt.

Example 12 includes the subject matter of any one of Examples 1-11, wherein the magnetoelectric layer comprises boron, iron, and oxygen.

Example 13 includes the subject matter of Example 12, and wherein the magnetoelectric layer further comprises lanthanum.

Example 14 includes the subject matter of any one of Examples 1-13, wherein the magnetoelectric layer comprises chromium and oxygen.

Example 15 includes the subject matter of Example 14, wherein the magnetoelectric layer further comprises boron.

Example 16 includes the subject matter of any one of Examples 1-15, wherein the first insulating layer and the second insulating layer comprise magnesium and oxygen.

Example 17 includes the subject matter of any one of Examples 1-15, wherein the first insulating layer and the second insulating layer comprise aluminum and oxygen.

Example 18 includes the subject matter of any one of Examples 1-17, wherein the third ferromagnetic layer has a first magnetization orientation and the fifth ferromagnetic layer has a second magnetization orientation, the first magnetization orientation substantially opposite to the second magnetization orientation.

Example 19 includes the subject matter of Example 1, wherein the third and fifth ferromagnetic layers comprise cobalt, iron, and boron and the second and fourth ferromagnetic layers comprise cobalt, iron, and oxygen.

Example 20 includes the subject matter of Example 1, wherein the third and fifth ferromagnetic layers comprise nickel and iron and the second and fourth ferromagnetic layers comprise cobalt; or cobalt, iron, and oxygen.

Example 21 includes the subject matter of any one of Examples 1-20, further comprising a second electrode positioned adjacent to the magnetoelectric layer, the second electrode and the first ferromagnetic layer positioned adjacent to a first surface of the magnetoelectric layer, the first electrode positioned adjacent to a second surface of the magnetoelectric layer, the second surface of the magnetoelectric layer opposite to the first surface of the magnetoelectric layer; a third electrode positioned adjacent to the third ferromagnetic layer; a fourth electrode positioned adjacent to the fifth ferromagnetic layer; and a fifth electrode positioned adjacent to the conductive layer.

Example 22 includes the subject matter of Example 21, wherein the third electrode and the fourth electrode comprise ruthenium and tantalum.

Example 23 includes the subject matter of Example 21, wherein the third electrode and the fourth electrode comprise tantalum and tungsten.

Example 24 includes the subject matter of any one of Examples 1-23, wherein the apparatus is a processor unit.

Example 25 includes the subject matter of any one of Examples 1-23, wherein the apparatus is an integrated circuit component.

Example 26 includes the subject matter of any one of Examples 1-23, wherein the apparatus further comprises a printed circuit board and an integrated circuit component attached to the printed circuit board, the integrated circuit component comprising the magnetoelectric layer, the first magnetic tunnel junction, and the second magnetic tunnel junction.

Example 27 includes the subject matter of Example 26, wherein the apparatus further comprises one or more memories attached to the printed circuit board.

Example 28 includes the subject matter of any one of Examples 1-23, wherein the apparatus is a computing device comprising a processor unit, the processor unit comprising the magnetoelectric layer, the first electrode, the first ferromagnetic layer, the first magnetic tunnel junction, the second magnetic tunnel junction, and the conductive layer.

Example 29 includes an apparatus comprising a first magnetoelectric magnetic tunnel junction (MEMTJ); and a second MEMTJ, individual of the first MEMTJ and the second MEMTJ comprising a magnetoelectric capacitor comprising a first electrode; a first ferromagnetic layer; and a magnetoelectric layer positioned between the first electrode and the first ferromagnetic layer; a first magnetic tunnel junction comprising a second ferromagnetic layer; a third ferromagnetic layer; and a first insulating layer positioned between the second ferromagnetic layer and the third ferromagnetic layer; a second magnetic tunnel junction comprising a fourth ferromagnetic layer; a fifth ferromagnetic layer; and a second insulating layer positioned between the fourth ferromagnetic layer and the fifth ferromagnetic layer; a conductive layer positioned between the first ferromagnetic layer and the second ferromagnetic layer and between the first ferromagnetic layer and the fourth ferromagnetic layer; and a second electrode positioned adjacent to the conductive layer; wherein the second electrode of the first MEMTJ is conductively coupled to the first electrode of the second MEMTJ.

Example 30 includes the subject matter of Example 29, wherein the second electrode of the first MEMTJ is conductively coupled to the first electrode of the second MEMTJ by a via.

Example 31 includes the subject matter of Example 29, wherein the second electrode of the first MEMTJ is conductively coupled to the first electrode of the second MEMTJ by one or more interconnects and one or more vias.

Example 32 includes an apparatus comprising a first magnetoelectric magnetic tunnel junction (MEMTJ); a second MEMTJ; a third MEMTJ; and a fourth MEMTJ, individual of the first MEMTJ, the second MEMTJ, the third MEMTJ, and the fourth MEMTJ comprising a magnetoelectric capacitor comprising a first electrode; a first ferromagnetic layer; and a magnetoelectric layer positioned between the first electrode and the first ferromagnetic layer; a first magnetic tunnel junction comprising a second ferromagnetic layer; a third ferromagnetic layer; and a first insulating layer positioned between the second ferromagnetic layer and the third ferromagnetic layer; a second magnetic tunnel junction comprising a fourth ferromagnetic layer; a fifth ferromagnetic layer; and a second insulating layer positioned between the fourth ferromagnetic layer and the fifth ferromagnetic layer; a conductive layer positioned between the first ferromagnetic layer and the second ferromagnetic layer and between the first ferromagnetic layer and the fourth ferromagnetic layer; and a second electrode positioned adjacent to the conductive layer; wherein the second electrode of the first MEMTJ, the second electrode of the second MEMTJ, and the second electrode of the third MEMTJ are conductively coupled to the first electrode of the fourth MEMTJ.

Example 33 includes the subject matter of Example 32, wherein individual of the second electrode of the first MEMTJ, the second electrode of the second MEMTJ, and the second electrode of the third MEMTJ are conductively coupled to the first electrode of the fourth MEMTJ by one or more interconnects and one or more vias.

Example 34 includes a method comprising forming a magnetoelectric capacitor on an integrated circuit structure, the magnetoelectric capacitor comprising a first electrode, a first ferromagnetic layer, and a magnetoelectric layer positioned between the first electrode and the first ferromagnetic layer; forming a second electrode positioned adjacent to the magnetoelectric layer; forming a conductive layer positioned adjacent to the first ferromagnetic layer; forming a first magnetic tunnel junction comprising a second ferromagnetic layer, a third ferromagnetic layer, and a first insulating layer positioned between the second ferromagnetic layer and the third ferromagnetic layer, the third ferromagnetic layer positioned adjacent to the conductive layer; and forming a second magnetic tunnel junction comprising a fourth ferromagnetic layer, a fifth ferromagnetic layer, and a second insulating layer positioned between the fourth ferromagnetic layer and the fifth ferromagnetic layer, the fifth ferromagnetic layer positioned adjacent to the conductive layer.

Example 35 includes the subject matter of Example 34, wherein the integrated circuit structure comprises a die substrate.

Example 36 includes the subject matter of Example 34, wherein the integrated circuit structure comprises one or more interconnect layers and the first electrode is conductively coupled to a line of one of the interconnect layers.

Example 37 includes the subject matter of Example 34, wherein the integrated circuit structure comprises one or more transistors.

The invention claimed is:

1. An apparatus comprising:
   a first electrode;
   a first ferromagnetic layer;
   a magnetoelectric layer positioned between the first electrode and the first ferromagnetic layer;
   a first magnetic tunnel junction comprising:
      a second ferromagnetic layer;
      a third ferromagnetic layer; and
      a first insulating layer positioned between the second ferromagnetic layer and the third ferromagnetic layer;
   a second magnetic tunnel junction comprising:
      a fourth ferromagnetic layer;
      a fifth ferromagnetic layer; and
      a second insulating layer positioned between the fourth ferromagnetic layer and the fifth ferromagnetic layer; and
   a conductive layer positioned between the first ferromagnetic layer and the second ferromagnetic layer and between the first ferromagnetic layer and the fourth ferromagnetic layer.

2. The apparatus of claim 1, wherein the first ferromagnetic layer comprises strontium, calcium, ruthenium, and oxygen.

3. The apparatus of claim 1, wherein the first ferromagnetic layer comprises strontium, iron, molybdenum, and oxygen.

4. The apparatus of claim 1, wherein the conductive layer comprises ruthenium.

5. The apparatus of claim 1, wherein the conductive layer comprises tantalum.

6. The apparatus of claim 1, wherein one or more of the first ferromagnetic layer, the second ferromagnetic layer, the third ferromagnetic layer, the fourth ferromagnetic layer, and the fifth ferromagnetic layer comprises iron, cobalt, and boron.

7. The apparatus of claim 1, wherein one or more of the first ferromagnetic layer, the second ferromagnetic layer, the third ferromagnetic layer, the fourth ferromagnetic layer, and the fifth ferromagnetic layer comprises iron and cobalt.

8. The apparatus of claim 1, wherein the magnetoelectric layer comprises boron, iron, and oxygen.

9. The apparatus of claim 8, wherein the magnetoelectric layer further comprises lanthanum.

10. The apparatus of claim 1, wherein the magnetoelectric layer comprises chromium and oxygen.

11. The apparatus of claim 10, wherein the magnetoelectric layer further comprises boron.

12. The apparatus of claim 1, wherein the first insulating layer and the second insulating layer comprise magnesium and oxygen.

13. The apparatus of claim 1, wherein the first insulating layer and the second insulating layer comprise aluminum and oxygen.

14. The apparatus of claim 1, wherein the third ferromagnetic layer has a first magnetization orientation and the fifth ferromagnetic layer has a second magnetization orientation, the first magnetization orientation substantially opposite to the second magnetization orientation.

15. The apparatus of claim 1, wherein the third and fifth ferromagnetic layers comprise cobalt, iron, and boron and the second and fourth ferromagnetic layers comprise cobalt, iron, and oxygen.

16. The apparatus of claim 1, wherein the third and fifth ferromagnetic layers comprise nickel and iron and the second and fourth ferromagnetic layers comprise:
   cobalt; or
   cobalt, iron, and oxygen.

17. The apparatus of claim 1, further comprising:
   a second electrode positioned adjacent to the magnetoelectric layer, the second electrode and the first ferromagnetic layer positioned adjacent to a first surface of the magnetoelectric layer, the first electrode positioned adjacent to a second surface of the magnetoelectric layer, the second surface of the magnetoelectric layer opposite to the first surface of the magnetoelectric layer;
   a third electrode positioned adjacent to the third ferromagnetic layer;
   a fourth electrode positioned adjacent to the fifth ferromagnetic layer; and
   a fifth electrode positioned adjacent to the conductive layer.

18. The apparatus of claim 17, wherein the third electrode and the fourth electrode comprise ruthenium and tantalum.

19. The apparatus of claim 17, wherein the third electrode and the fourth electrode comprise tantalum and tungsten.

20. The apparatus of claim 1, wherein the apparatus is an integrated circuit component.

21. The apparatus of claim 1, wherein the apparatus further comprises a printed circuit board and an integrated circuit component attached to the printed circuit board, the integrated circuit component comprising the magnetoelectric layer, the first magnetic tunnel junction, and the second magnetic tunnel junction.

22. An apparatus comprising:
   a first magnetoelectric magnetic tunnel junction (MEMTJ); and
   a second MEMTJ, individual of the first MEMTJ and the second MEMTJ comprising:
      a magnetoelectric capacitor comprising:
         a first electrode;
         a first ferromagnetic layer; and
         a magnetoelectric layer positioned between the first electrode and the first ferromagnetic layer;
      a first magnetic tunnel junction comprising:
         a second ferromagnetic layer;
         a third ferromagnetic layer; and a first insulating layer positioned between the second ferromagnetic layer and the third ferromagnetic layer;

a second magnetic tunnel junction comprising:
  a fourth ferromagnetic layer;
  a fifth ferromagnetic layer; and
  a second insulating layer positioned between the fourth ferromagnetic layer and the fifth ferromagnetic layer;

a conductive layer positioned between the first ferromagnetic layer and the second ferromagnetic layer and between the first ferromagnetic layer and the fourth ferromagnetic layer; and a second electrode positioned adjacent to the conductive layer;

wherein the second electrode of the first MEMTJ is conductively coupled to the first electrode of the second MEMTJ.

23. The apparatus of claim 22, wherein the second electrode of the first MEMTJ is conductively coupled to the first electrode of the second MEMTJ by one or more interconnects and one or more vias.

24. An apparatus comprising:

a first magnetoelectric magnetic tunnel junction (MEMTJ);

a second MEMTJ;

a third MEMTJ; and a fourth MEMTJ, individual of the first MEMTJ, the second MEMTJ, the third MEMTJ, and the fourth MEMTJ comprising:
  a magnetoelectric capacitor comprising:
    a first electrode;

a first ferromagnetic layer; and
    a magnetoelectric layer positioned between the first electrode and the first ferromagnetic layer;
  a first magnetic tunnel junction comprising:
    a second ferromagnetic layer;
    a third ferromagnetic layer; and
    a first insulating layer positioned between the second ferromagnetic layer and the third ferromagnetic layer;
  a second magnetic tunnel junction comprising:
    a fourth ferromagnetic layer;
    a fifth ferromagnetic layer; and
    a second insulating layer positioned between the fourth ferromagnetic layer and the fifth ferromagnetic layer;
  a conductive layer positioned between the first ferromagnetic layer and the second ferromagnetic layer and between the first ferromagnetic layer and the fourth ferromagnetic layer; and
  a second electrode positioned adjacent to the conductive layer;

wherein the second electrode of the first MEMTJ, the second electrode of the second MEMTJ, and the second electrode of the third MEMTJ are conductively coupled to the first electrode of the first MEMTJ.

25. The apparatus of claim 24, wherein individual of the second electrode of the first MEMTJ, the second electrode of the second MEMTJ, and the second electrode of the third MEMTJ are conductively coupled to the first electrode of the second MEMTJ by one or more interconnects and one or more vias.

* * * * *